US010928855B2

(12) United States Patent
Knoppert

(10) Patent No.: US 10,928,855 B2
(45) Date of Patent: Feb. 23, 2021

(54) DOCK WITH ACTIVELY CONTROLLED HEATSINK FOR A MULTI-FORM FACTOR INFORMATION HANDLING SYSTEM (IHS)

(71) Applicant: Dell Products, L.P., Round Rock, TX (US)

(72) Inventor: Michiel Sebastiaan Emanuel Petrus Knoppert, Amsterdam (NL)

(73) Assignee: Dell Products, L.P., Round Rock, TX (US)

( * ) Notice: Subject to any disclaimer, the term of this patent is extended or adjusted under 35 U.S.C. 154(b) by 0 days.

(21) Appl. No.: 16/228,242

(22) Filed: Dec. 20, 2018

(65) Prior Publication Data
US 2020/0201387 A1 Jun. 25, 2020

(51) Int. Cl.
G06F 1/16 (2006.01)
G06F 1/20 (2006.01)
H05K 7/20 (2006.01)

(52) U.S. Cl.
CPC .......... *G06F 1/1632* (2013.01); *G06F 1/1647* (2013.01); *G06F 1/1681* (2013.01); *G06F 1/203* (2013.01); *G06F 1/206* (2013.01); *H05K 7/20172* (2013.01); *H05K 7/20336* (2013.01); *G06F 2200/201* (2013.01)

(58) Field of Classification Search
CPC .... G06F 1/1632; G06F 1/1647; G06F 1/1681; G06F 1/203; G06F 1/206; G06F 2200/201; H05K 7/20172; H05K 7/20336
USPC .................................................. 361/679.47
See application file for complete search history.

(56) References Cited

U.S. PATENT DOCUMENTS

| 5,436,792 | A | * | 7/1995 | Leman | F16M 11/041 16/326 |
| 5,704,212 | A | * | 1/1998 | Erler | F25B 21/04 361/679.41 |
| 5,739,810 | A | | 4/1998 | Merkel | |
| 5,751,548 | A | * | 5/1998 | Hall | F16C 11/10 248/122.1 |
| 5,847,698 | A | | 12/1998 | Reavey et al. | |
| 5,898,569 | A | * | 4/1999 | Bhatia | G06F 1/203 165/80.2 |
| 5,974,556 | A | * | 10/1999 | Jackson | G06F 1/203 713/322 |
| 6,084,769 | A | * | 7/2000 | Moore | G06F 1/203 165/104.33 |
| 6,094,347 | A | * | 7/2000 | Bhatia | G06F 1/203 165/104.33 |

(Continued)

OTHER PUBLICATIONS

Binary Fortress Software, "Precise Monitor Controls," 2017-2018, 2 pages, retrieved Oct. 15, 2018, available at https://www.displayfusion.com/Features/MonitorConfig/.

(Continued)

*Primary Examiner* — Anatoly Vortman
(74) *Attorney, Agent, or Firm* — Fogarty LLP

(57) ABSTRACT

Embodiments of a dock with an actively controlled heatsink for a multi-form factor Information Handling System (IHS) are described. In some embodiments, a dock may include: a base, a plateau configured to receive an IHS, and an arm coupling a distal edge of the base to a proximal edge of the plateau, where the plateau comprises a heatsink configured to cool a heatpipe disposed within the IHS via a bottom surface of the IHS.

11 Claims, 27 Drawing Sheets

(56) References Cited

U.S. PATENT DOCUMENTS

| | | | | |
|---|---|---|---|---|
| 6,109,039 | A * | 8/2000 | Hougham | G06F 1/203 62/259.2 |
| 6,172,871 | B1 * | 1/2001 | Holung | G06F 1/1632 165/104.33 |
| 6,181,553 | B1 * | 1/2001 | Cipolla | G06F 1/1632 165/104.33 |
| 6,239,970 | B1 * | 5/2001 | Nakai | G06F 1/1616 165/185 |
| 6,256,193 | B1 * | 7/2001 | Janik | A47B 23/043 248/922 |
| 6,307,746 | B1 * | 10/2001 | Beckman | G06F 1/203 361/679.46 |
| 6,353,529 | B1 * | 3/2002 | Cies | G06F 1/1616 248/917 |
| 6,415,612 | B1 * | 7/2002 | Pokharna | F25B 21/02 165/80.2 |
| 6,430,038 | B1 * | 8/2002 | Helot | G06F 1/1616 248/917 |
| 6,431,511 | B1 * | 8/2002 | Pfister | F16M 11/10 248/274.1 |
| 6,437,978 | B1 * | 8/2002 | Ozaki | G06F 1/203 165/104.33 |
| 6,445,580 | B1 * | 9/2002 | Cohen | G06F 1/20 257/E23.082 |
| 6,453,378 | B1 * | 9/2002 | Olson | G06F 1/1632 361/679.41 |
| 6,510,048 | B2 | 1/2003 | Rubenson et al. | |
| 6,646,874 | B2 * | 11/2003 | Pokharna | G06F 1/1632 361/679.09 |
| 6,700,773 | B1 | 3/2004 | Adriaansen et al. | |
| 6,700,775 | B1 * | 3/2004 | Chuang | G06F 1/1626 361/679.01 |
| 6,922,333 | B2 | 7/2005 | Weng et al. | |
| 6,966,358 | B2 * | 11/2005 | Rapaich | G06F 1/1632 165/104.33 |
| 7,068,496 | B2 * | 6/2006 | Wong | G06F 1/1615 16/223 |
| 7,061,472 | B1 | 7/2006 | Schweizer et al. | |
| 7,281,698 | B2 * | 10/2007 | Patterson, Jr. | A45C 11/00 206/756 |
| 7,298,613 | B2 * | 11/2007 | Yin | G06F 1/1632 361/679.41 |
| 7,342,783 | B2 * | 3/2008 | Park | G06F 1/1632 165/80.3 |
| 7,352,565 | B2 * | 4/2008 | Yin | G06F 1/1616 248/917 |
| 7,471,511 | B2 * | 12/2008 | Montag | G06F 1/1601 348/730 |
| 7,472,215 | B1 * | 12/2008 | Mok | G06F 1/1632 710/304 |
| 7,551,428 | B2 | 7/2009 | Homer et al. | |
| 7,663,602 | B2 | 2/2010 | Jones et al. | |
| 7,828,260 | B2 * | 11/2010 | Hauser | A47B 23/043 248/447 |
| 7,911,784 | B2 * | 3/2011 | Jones | G06F 1/1632 248/346.03 |
| 7,916,468 | B2 * | 3/2011 | Takizawa | F16M 11/105 361/679.41 |
| 7,917,993 | B2 * | 4/2011 | Park | G06F 1/1616 16/235 |
| 7,990,702 | B2 | 8/2011 | Tracy et al. | |
| 7,991,442 | B2 | 8/2011 | Kim | |
| 8,310,823 | B2 | 11/2012 | Stoltz | |
| 8,331,098 | B2 | 12/2012 | Leung | |
| 8,567,740 | B2 * | 10/2013 | Tarnutzer | B42D 9/00 248/454 |
| 8,724,314 | B2 * | 5/2014 | Pais | G06F 1/1632 165/80.3 |
| 8,803,816 | B2 | 8/2014 | Kilpatrick, II et al. | |
| 8,988,876 | B2 | 3/2015 | Corbin et al. | |
| 9,684,342 | B2 | 6/2017 | Kim et al. | |
| 9,740,237 | B2 | 8/2017 | Moore et al. | |
| 9,874,908 | B2 | 1/2018 | Han et al. | |
| 9,995,428 | B2 * | 6/2018 | Schwartz | A47B 23/04 |
| 2002/0012228 | A1 * | 1/2002 | Ozaki | G06F 1/203 361/679.48 |
| 2004/0001049 | A1 | 1/2004 | Oakley | |
| 2004/0042173 | A1 * | 3/2004 | Tomioka | G06F 1/203 361/679.53 |
| 2005/0068728 | A1 * | 3/2005 | Chu | G06F 1/20 361/690 |
| 2006/0082518 | A1 * | 4/2006 | Ram | G06F 1/1601 345/1.1 |
| 2006/0183505 | A1 | 8/2006 | Willrich | |
| 2009/0244016 | A1 | 10/2009 | Casparian et al. | |
| 2010/0238620 | A1 | 9/2010 | Fish | |
| 2010/0321275 | A1 | 12/2010 | Hinckley et al. | |
| 2011/0310312 | A1 * | 12/2011 | Yokote | G06F 1/20 348/836 |
| 2015/0103014 | A1 | 4/2015 | Kim et al. | |
| 2015/0192971 | A1 * | 7/2015 | Shah | G06F 1/203 361/679.41 |
| 2017/0038805 | A1 * | 2/2017 | Chun | G06F 1/206 |
| 2017/0069299 | A1 | 3/2017 | Kwak et al. | |
| 2017/0255320 | A1 | 9/2017 | Kumar et al. | |
| 2017/0344120 | A1 | 11/2017 | Zuniga et al. | |
| 2018/0088632 | A1 | 3/2018 | Dreessen et al. | |
| 2018/0121012 | A1 | 5/2018 | Asrani | |
| 2018/0129391 | A1 | 5/2018 | Files et al. | |
| 2018/0188774 | A1 | 7/2018 | Ent et al. | |
| 2018/0232010 | A1 | 8/2018 | Kummer et al. | |
| 2019/0257555 | A1 * | 8/2019 | Rowe | F25B 21/00 |

OTHER PUBLICATIONS

Microsoft, "ChangeDisplaySettingsExA function," 7 pages, retrieved Oct. 15, 2018, available at https://msdn.microsoft.com/en-us/library/dd183413(v=vs.85).aspx VS. https://docs.microsoft.com/en-us/windows/desktop/api/winuser/nf-winuser-changedisplaysettingsexa.

Microsoft, "SendKeys.Send(String) Method," 6 pages, retrieved Oct. 11, 2018, available at https://msdn.microsoft.com/en-us/library/system.windows.forms.sendkeys.send(v=vs.110).aspx.

Microsoft, "DoDragDrop function," 4 pages, retrieved Oct. 11, 2018, available at https://msdn.microsoft.com/en-us/library/windows/desktop/ms678486(v=vs.85).aspx.

Microsoft, "System Events and Mouse Messages," published May 30, 2018, 4 pages, retrieved Oct. 11, 2018, available at https://msdn.microsoft.com/en-us/library/windows/desktop/ms703320(v=vs.85).aspx.

Microsoft, "InkSystemGesture Enumeration," 3 pages, retrieved Oct. 11, 2018, available at https://msdn.microsoft.com/en-us/library/windows/desktop/ms695579(v=vs.85).aspx.

Microsoft, "GetWindowRect function," 3 pages, retrieved Oct. 11, 2018, available at https://msdn.microsoft.com/en-us/library/windows/desktop/ms633519(v=vs.85).aspx.

Microsoft, "PointerRoutedEventArgs Class," 9 pages, retrieved Oct. 11, 2018, available at https://docs.microsoft.com/en-us/uwp/api/Windows.UI.Xaml.Input.PointerRoutedEventArgs#Windows_UI_Xaml_Input_PointerRoutedEventArgs_GetCurrentPoint_Windows_UI_Xaml_UIElement_.

Microsoft, "SetWindowPos function," 7 pages, retrieved Oct. 11, 2018, available at https://msdn.microsoft.com/en-us/library/windows/desktop/ms633545(v=vs.85).aspx.

Microsoft, "Time Functions," published May 30, 2018, 5 pages, retrieved Oct. 11, 2018, available at https://msdn.microsoft.com/en-us/library/windows/desktop/ms725473(v=vs.85).aspx.

Microsoft, "How Do I Detect a Window Open Event," 11 pages, retrieved Oct. 15, 2018, available at https://social.msdn.microsoft.com/Forums/vstudio/en-US/1953f400-6f1c-49e0-a63e-d724bccc7676/how-do-i-detect-a-window-open-event?forum=csharpgeneral.

Microsoft, "How Do I Maximize/Minimize Applications Programmatically in C#?," 2 pages, retrieved Oct. 15, 2018, available at https://social.msdn.microsoft.com/Forums/vstudio/en-US/9bde4870-1599-4958-9ab4-902fa98ba53a/how-do-i-maximizeminimize-applications-programmatically-in-c?forum=csharpgeneral.

(56) References Cited

OTHER PUBLICATIONS

Microsoft, "WinMain Entry Point," 7 pages, retrieved Oct. 15, 2018, available at https://msdn.microsoft.com/en-us/library/ms633559(vs.85).aspx.

Stack Overflow, "How Can I Split a Window in Two in Windows API," 6 pages, retrieved Oct. 15, 2018, available at https://stackoverflow.com/questions/10467112/how-can-i-split-a-window-in-two-in-windows-api.

Microsoft, "Application User Model IDs (AppUserModelIDs)," published May 30, 2018, 8 pages, retrieved Oct. 15, 2018, available at https://docs.microsoft.com/en-us/windows/desktop/shell/appids.

Microsoft, "Mouse Events in Windows Forms," published Mar. 29, 2017, 6 pages, retrieved Oct. 15, 2018, available at https://docs.microsoft.com/en-us/dotnet/framework/winforms/mouse-events-in-windows-forms.

* cited by examiner

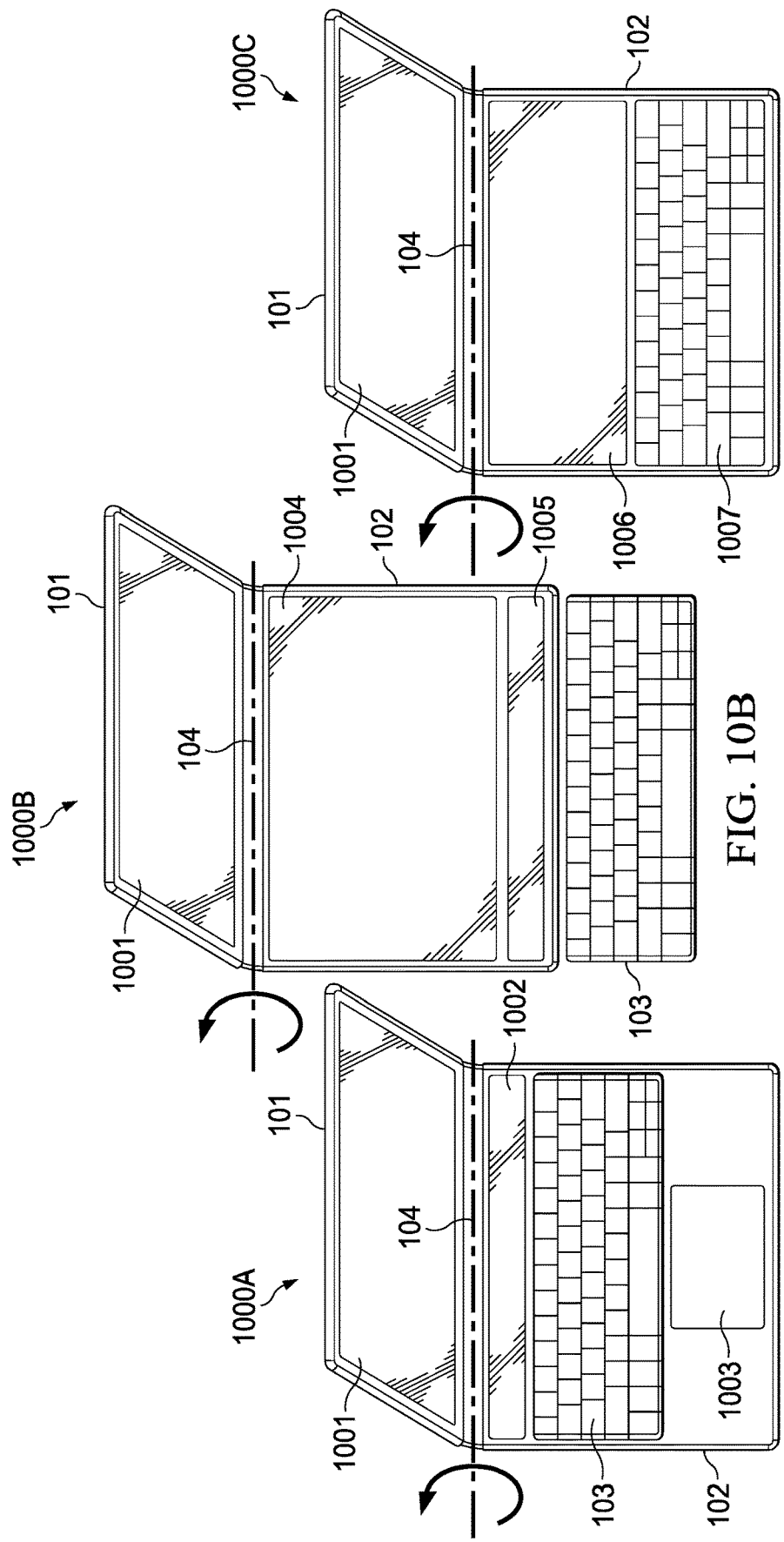

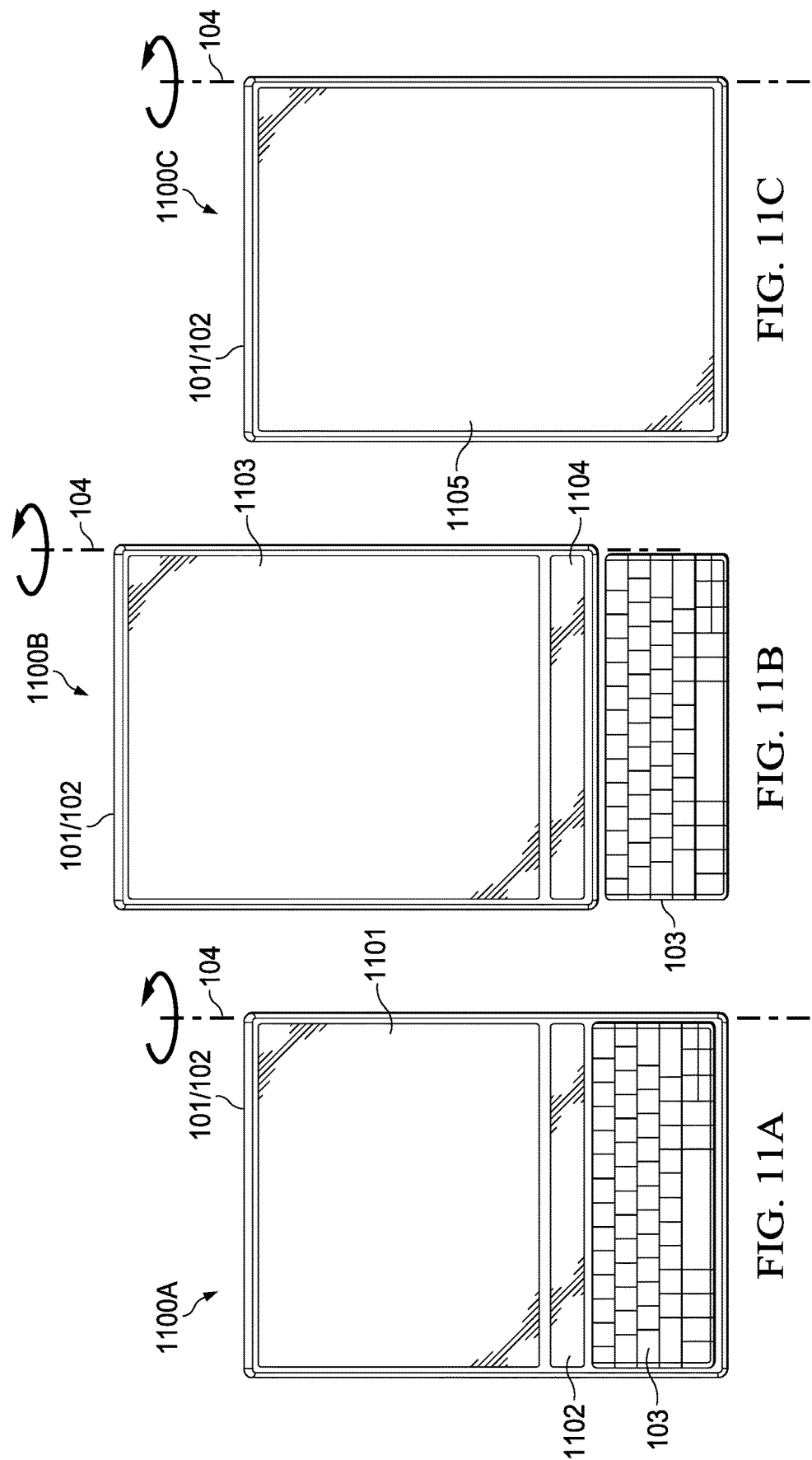

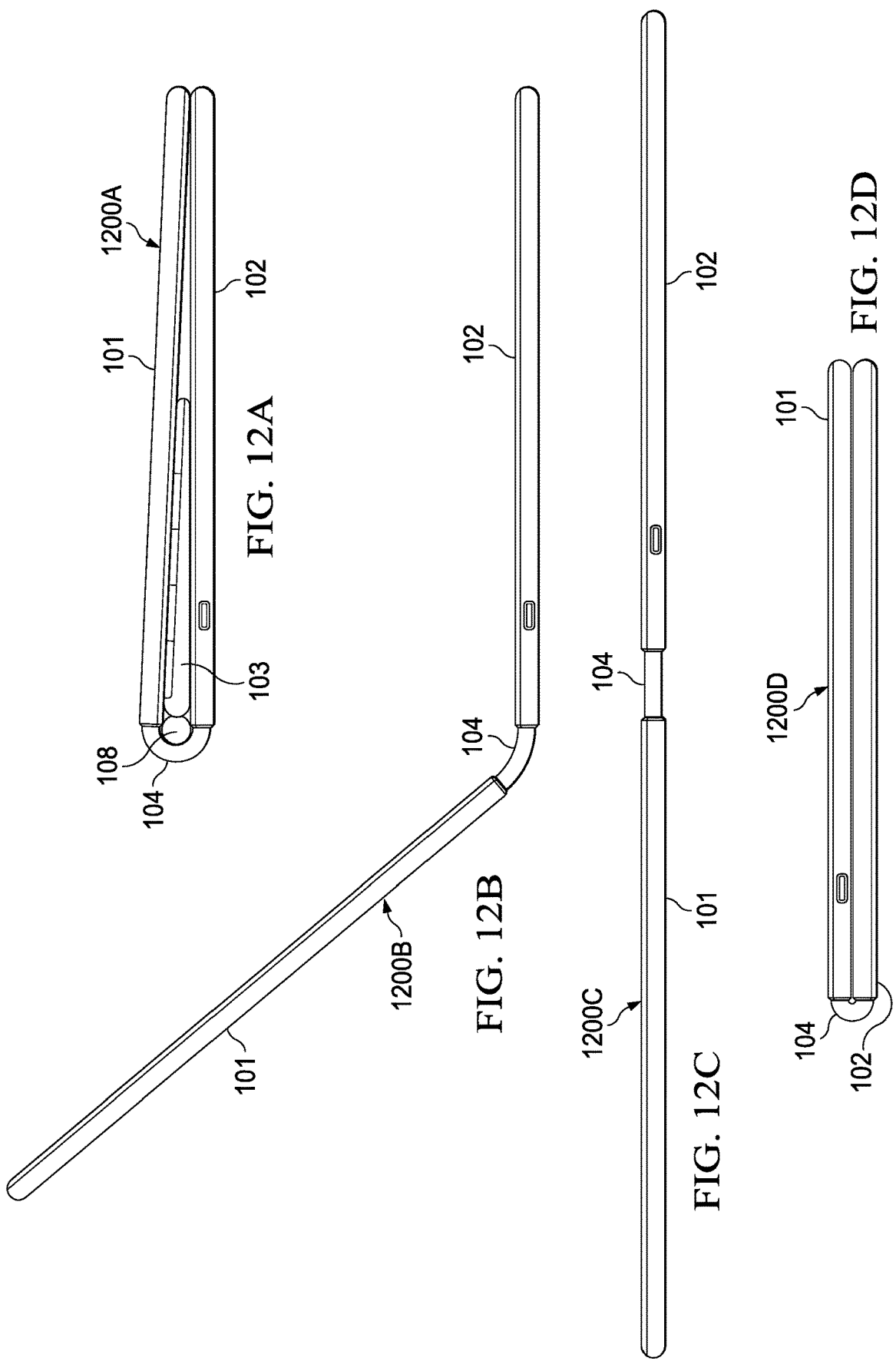

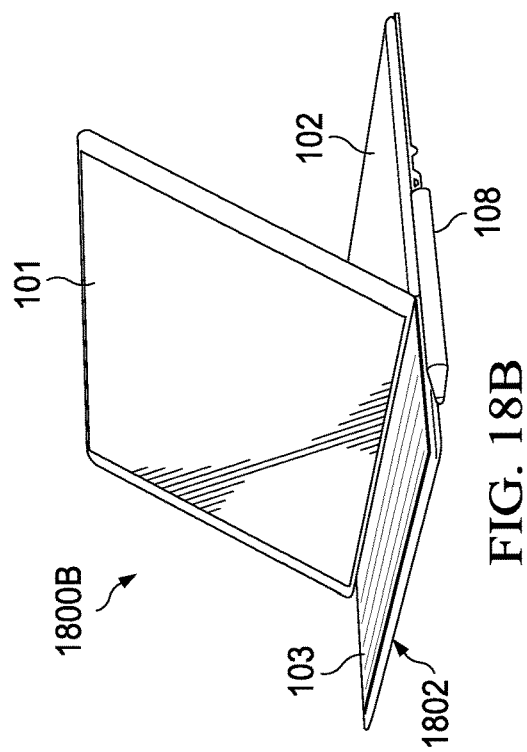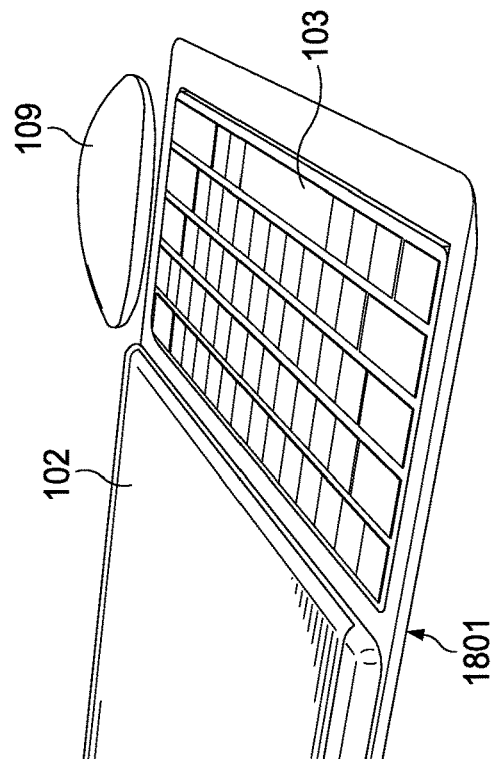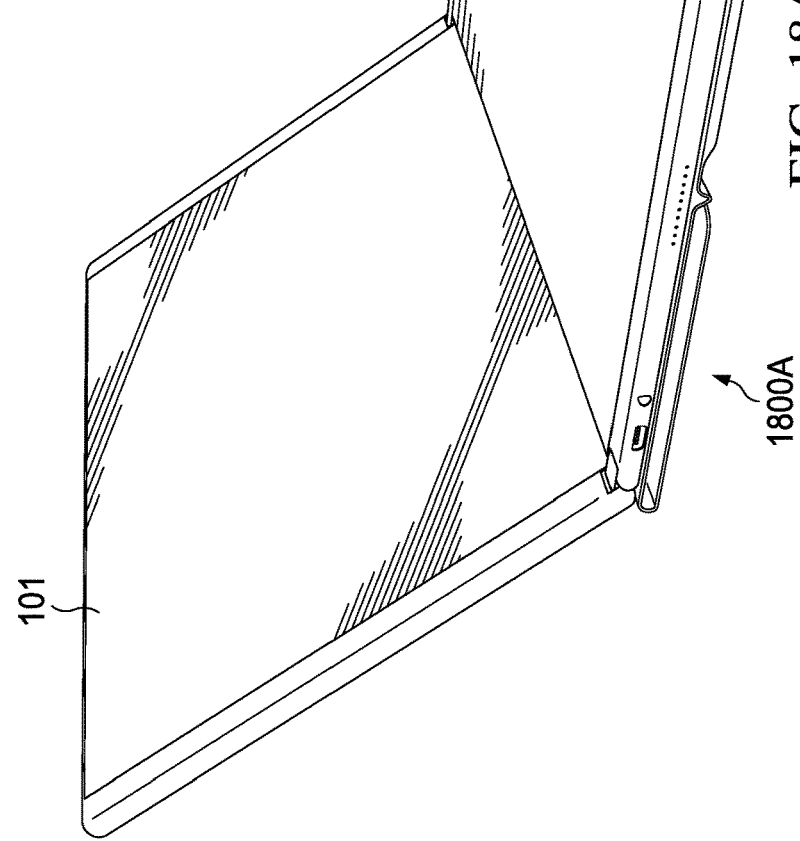

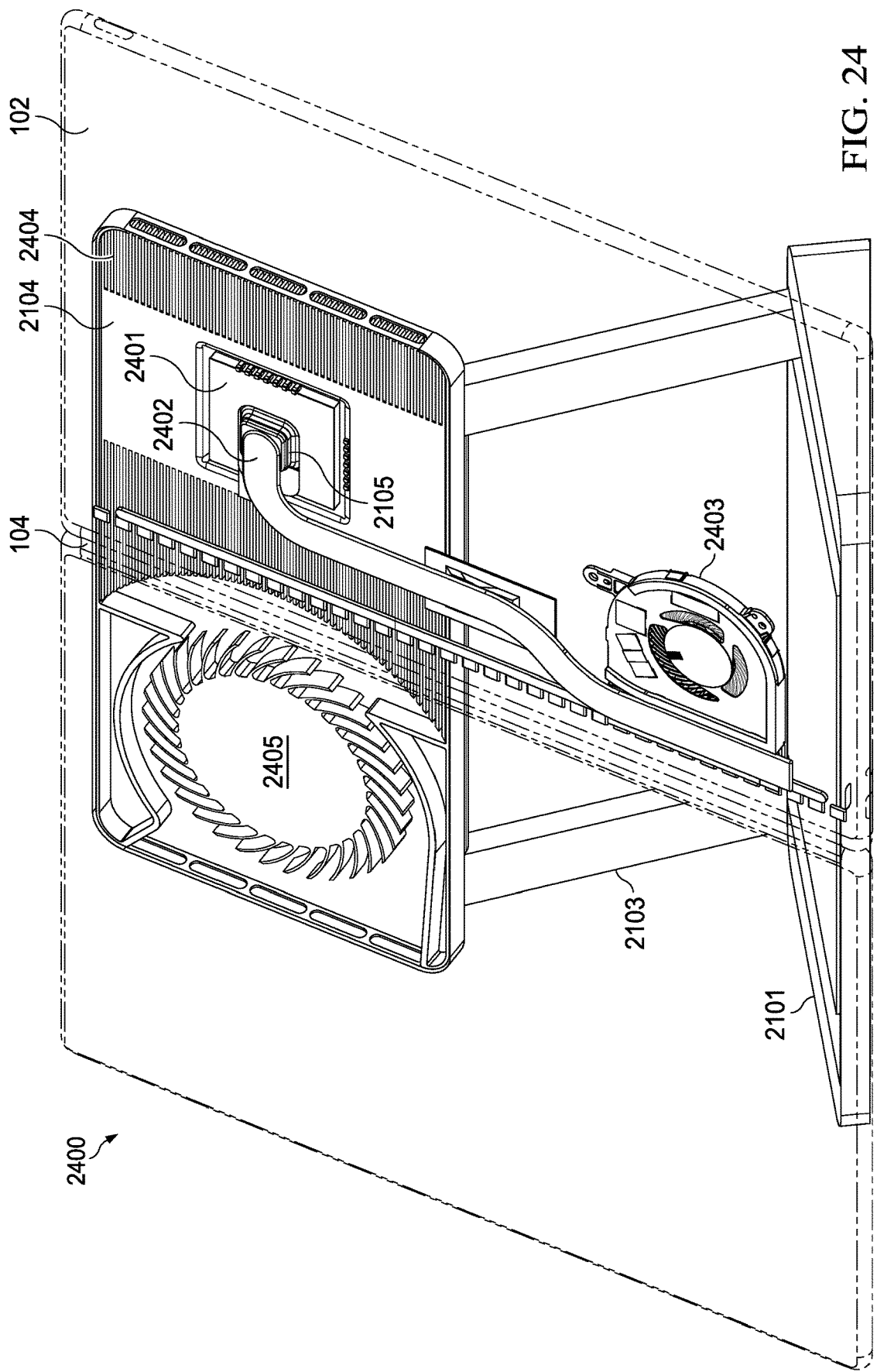

DOCK WITH ACTIVELY CONTROLLED HEATSINK FOR A MULTI-FORM FACTOR INFORMATION HANDLING SYSTEM (IHS)

FIELD

This disclosure relates generally to Information Handling Systems (IHSs), and more specifically, to a dock with an actively controlled heatsink for a multi-form factor IHS.

BACKGROUND

As the value and use of information continues to increase, individuals and businesses seek additional ways to process and store information. One option available to users is Information Handling Systems (IHSs). An IHS generally processes, compiles, stores, and/or communicates information or data for business, personal, or other purposes thereby allowing users to take advantage of the value of the information. Because technology and information handling needs and requirements vary between different users or applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

Nowadays, users can choose among many different types of mobile IHS devices. Each type of device (e.g., tablets, 2-in-1s, mobile workstations, notebooks, netbooks, ultrabooks, etc.) has unique portability, performance, and usability features; however, each also has its own trade-offs and limitations. For example, tablets have less compute power than notebooks and workstations, while notebooks and workstations lack the portability of tablets. A conventional 2-in-1 device combines the portability of a tablet with the performance of a notebook, but with a small display—an uncomfortable form factor in many use-cases.

The inventors hereof have determined that, as productivity continues to be a core tenet of modern computing, mobile IHS devices should provide versatility for many use-cases and display postures in use today (e.g., tablet mode, laptop mode, etc.), as well as future display postures (e.g., digital notebooks, new work surfaces, etc.). Additionally, mobile IHS devices should provide larger display area with reduced size and weight.

SUMMARY

Embodiments of a dock with an actively controlled heatsink for a multi-form factor Information Handling System (IHS) are described. In an illustrative, non-limiting embodiment, a dock may include: a base; a plateau configured to receive an Information Handling System (IHS); and an arm coupling a distal edge of the base to a proximal edge of the plateau, wherein the plateau comprises a heatsink configured to cool a heatpipe disposed within the IHS via a bottom surface of the IHS.

In some cases, the heatsink may include a solid-state heat pump. Additionally, or alternatively, the heatsink may include a magnetocaloric element. The plateau may include a positioning nib. The heatsink may be configured to contact a first end of the heatpipe via the positioning nib. A second end of the heatpipe may be coupled to a fan assembly within the IHS. The plateau may further include a fan directed toward the bottom surface of the IHS.

In some cases, the IHS may include a first display coupled to a second display via a hinge. The plateau may also include a magnetic device, and the second display may include a second magnetic device positioned to mate with the magnetic device and a second positioning nib positioned to mate with the positioning nib in the plateau. The first display may include a third magnetic device positioned to match the magnetic device in the plateau when the plateau receives the IHS in dual-display mode. The arm may rotate with respect to the base around a first axis to lift the plateau, the plateau may rotate with respect to the arm around a second axis to tilt the plateau, and the second axis may be parallel with respect to the first axis.

The dock may also include a controller or processor, and a memory having program instructions stored thereon that, upon execution, cause the controller or processor to identify a posture of the IHS. The program instructions may also cause the controller or processor to control operation the heatsink, at least in part, in response to the posture. The posture may be selected from the group consisting of: dual-monitor mode, book mode, and laptop mode.

In another illustrative, non-limiting embodiment, a method may include coupling an IHS to a plateau of a dock, wherein the plateau comprises a heatsink configured to cool a heatpipe disposed within the IHS via a bottom surface of the IHS; identifying a posture of the IHS; and controlling operation of the heatsink, at least in part, in response to the posture.

The heatsink may include a solid-state heat pump, and controlling operation of the heatsink may include adjusting a voltage applied to the solid-state heat pump. In some cases, the IHS may include a first display coupled to a second display via a hinge, and identifying the posture may include detecting an angle of the hinge.

In yet another illustrative, non-limiting embodiment, a hardware memory device may have program instructions stored thereon that, upon execution by a processor of an IHS, cause the IHS to: identify a posture of the IHS coupled to a dock, where the IHS comprises a first display coupled to a second display via a hinge, and where the dock comprises a plateau having a heatsink configured to cool a heatpipe within the IHS via a bottom surface of the IHS; and control operation of the heatsink in response to the posture. The heatsink may include a solid-state heat pump, and controlling operation of the heatsink further may include adjusting a voltage applied to the solid-state heat pump. Identifying the posture may include detecting a hinge angle, and the posture may be selected from the group consisting of: dual-monitor mode, and laptop mode.

BRIEF DESCRIPTION OF THE DRAWINGS

The present invention(s) is/are illustrated by way of example and is/are not limited by the accompanying figures, in which like references indicate similar elements. Elements in the figures are illustrated for simplicity and clarity and have not necessarily been drawn to scale.

FIGS. 10A-C and 11A-C illustrate various use-cases, according to some embodiments.

FIGS. 12A-D, 13A, and 13B illustrate a first hinge implementation and a second hinge implementation, respectively, according to some embodiments.

FIGS. 18A and 18B illustrate a folio case system, according to some embodiments.

FIG. 24 illustrates an example of a dock with an actively controlled heatsink, according to some embodiments.

DETAILED DESCRIPTION

To facilitate explanation of the various systems and methods discussed herein, the following description has been split into sections. It should be noted, however, that any sections, headings, and subheadings used herein are for organizational purposes only, and are not meant to limit or otherwise modify the scope of the description nor the claims.

Overview

Embodiments described herein provide a dock with an actively controlled heatsink for a multi-form factor Information Handling System (IHS). In various implementations, a mobile IHS device may include a dual-display, foldable IHS. Each display may include, for example, a Liquid Crystal Display (LCD), Organic Light-Emitting Diode (OLED), or Active Matrix OLED (AMOLED) panel or film, equipped with a touchscreen configured to receive touch inputs. The dual-display, foldable IHS may be configured by a user in any of a number of display postures, including, but not limited to: laptop, tablet, book, clipboard, stand, tent, and/or display.

A user may operate the dual-display, foldable IHS in various modes using a virtual, On-Screen Keyboard (OSK), or a removable, physical keyboard. In some use cases, a physical keyboard may be placed atop at least one of the screens to enable use of the IHS as a laptop, with additional User Interface (UI) features (e.g., virtual keys, touch input areas, etc.) made available via the underlying display, around the keyboard. In other use cases, the physical keyboard may be placed in front of the IHS to expose a larger display area. The user may also rotate the dual-display, foldable IHS, to further enable different modalities with the use of the physical keyboard. In some cases, when not in use, the physical keyboard may be placed or stored inside the dual-display, foldable IHS.

Figure 1:
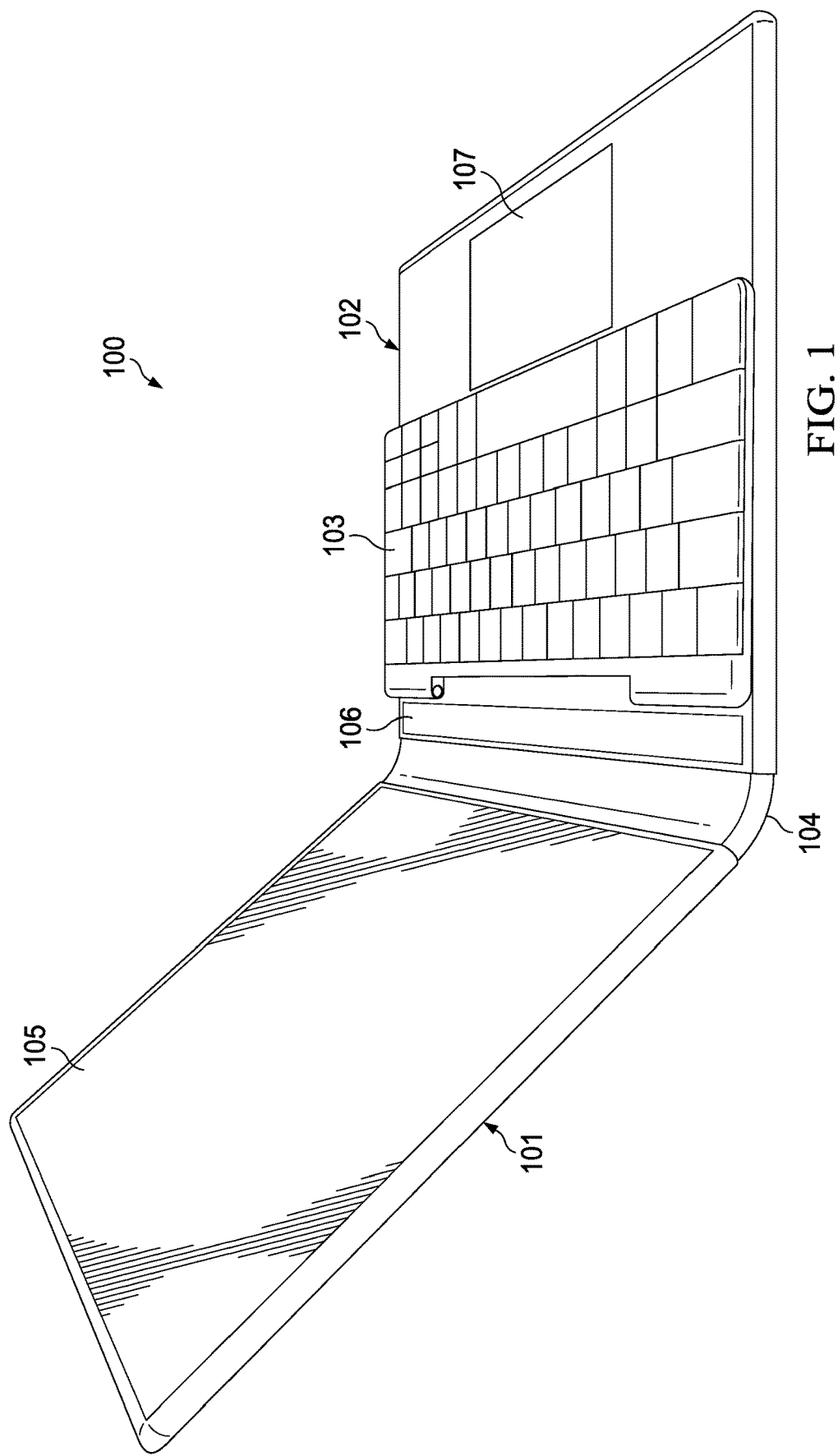
FIG. 1 is a perspective view of a multi-form factor Information Handling System (IHS) with a removable keyboard, according to some embodiments.

FIG. 1 is a perspective view of multi-form factor IHS 100 with removable keyboard 103. As shown, first display 101 is coupled to second display 102 via hinge 104, and keyboard 103 sits atop second display 102. The current physical arrangement of first display 101 and second display 102 creates a laptop posture, such that first display 101 becomes primary display area 105 presented by IHS 100, where video or display frames may be rendered for viewing by a user.

In operation, in this particular laptop posture, second display 102 may sit horizontally on a work surface with its display surface facing up, and keyboard 103 may be positioned on top of second display 102, occluding a part of its display surface. In response to this posture and keyboard position, IHS 100 may dynamically produce a first UI feature in the form of at least one configurable secondary display area 106 (a "ribbon area" or "touch bar"), and/or a second UI feature in the form of at least one configurable touch input area 107 (a "virtual trackpad"), using the touchscreen of second display 102.

To identify a current posture of IHS 100 and a current physical relationship or spacial arrangement (e.g., distance, position, speed, etc.) between display(s) 101/102 and keyboard 103, IHS 100 may be configured to use one or more sensors disposed in first display 101, second display 102, keyboard 103, and/or hinge 104. Based upon readings from these various sensors, IHS 100 may then select, configure, modify, and/or provide (e.g., content, size, position, etc.) one or more UI features.

In various embodiments, displays 101 and 102 may be coupled to each other via hinge 104 to thereby assume a plurality of different postures, including, but not limited, to: laptop, tablet, book, or display.

When display 102 is disposed horizontally in laptop posture, keyboard 103 may be placed on top of display 102, thus resulting in a first set of UI features (e.g., ribbon area or touch bar 106, and/or touchpad 107). Otherwise, with IHS 100 still in the laptop posture, keyboard 103 may be placed next to display 102, resulting in a second set of UI features.

As used herein, the term "ribbon area" or "touch bar" 106 refers to a dynamic horizontal or vertical strip of selectable and/or scrollable items, which may be dynamically selected for display and/or IHS control depending upon a present context, use-case, or application. For example, when IHS 100 is executing a web browser, ribbon area or touch bar 106 may show navigation controls and favorite websites. Then, when IHS 100 operates a mail application, ribbon area or touch bar 106 may display mail actions, such as replying or flagging. In some cases, at least a portion of ribbon area or touch bar 106 may be provided in the form of a stationary control strip, providing access to system features such as brightness and volume. Additionally, or alternatively, ribbon area or touch bar 106 may enable multitouch, to support two or more simultaneous inputs.

In some cases, ribbon area 106 may change position, location, or size if keyboard 103 is moved alongside a lateral or short edge of second display 102 (e.g., from horizontally displayed alongside a long side of keyboard 103 to being vertically displayed alongside a short side of keyboard 103). Also, the entire display surface of display 102 may show rendered video frames if keyboard 103 is moved alongside the bottom or long edge of display 102. Conversely, if keyboard 103 is removed of turned off, yet another set of UI features, such as an OSK, may be provided via display(s) 101/102. As such, in many embodiments, the distance and/or relative position between keyboard 103 and display(s) 101/102 may be used to control various aspects the UI.

During operation, the user may open, close, flip, swivel, or rotate either of displays 101 and/or 102, via hinge 104, to produce different postures. In each posture, a different arrangement between IHS 100 and keyboard 103 results in different UI features being presented or made available to the user. For example, when second display 102 is folded against display 101 so that the two displays have their backs against each other, IHS 100 may be said to have assumed a canvas posture (e.g., FIGS. 7A-F), a tablet posture (e.g., FIG. 7G-J), a book posture (e.g., FIG. 8D), a stand posture (e.g., FIGS. 9A and 9B), or a tent posture (e.g., FIGS. 9C and 9D), depending upon whether IHS 100 is stationary, moving, horizontal, resting at a different angle, and/or its orientation (landscape vs. portrait).

In many of these scenarios, placement of keyboard 103 upon or near display(s) 101/102, and subsequent movement or removal, may result in a different set of UI features than when IHS 100 is in laptop posture.

In many implementations, different types of hinges 104 may be used to achieve and maintain different display postures, and to support different keyboard arrangements. Examples of suitable hinges 104 include, but are not limited to: a 360-hinge (FIGS. 12A-D), a jaws hinge (FIGS. 13A and 13B), a watchband hinge (FIG. 15), a gear hinge (FIGS. 16A-C), and a slide hinge (FIGS. 17A and 17B). One or more of these hinges 104 may include wells or compartments (FIG. 14) for docking, cradling, charging, or storing accessories. Moreover, one or more aspects of hinge 104 may be monitored via one or more sensors (e.g., to determine whether an accessory is charging) when controlling the different UI features.

In some cases, a folio case system (FIGS. 18A and 18B) may be used to facilitate keyboard arrangements. Additionally, or alternatively, an accessory backpack system (FIG. 19) may be used to hold keyboard 103 and/or an extra battery or accessory.

For purposes of this disclosure, an IHS may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an IHS may be a personal computer (e.g., desktop or laptop), tablet computer, mobile device (e.g., Personal Digital Assistant (PDA) or smart phone), server (e.g., blade server or rack server), a network storage device, or any other suitable device and may vary in size, shape, performance, functionality, and price. An IHS may include Random Access Memory (RAM), one or more processing resources such as a Central Processing Unit (CPU) or hardware or software control logic, Read-Only Memory (ROM), and/or other types of nonvolatile memory. Additional components of an IHS may include one or more disk drives, one or more network ports for communicating with external devices as well as various I/O devices, such as a keyboard, a mouse, touchscreen, and/or a video display. An IHS may also include one or more buses operable to transmit communications between the various hardware components.

Figure 2:
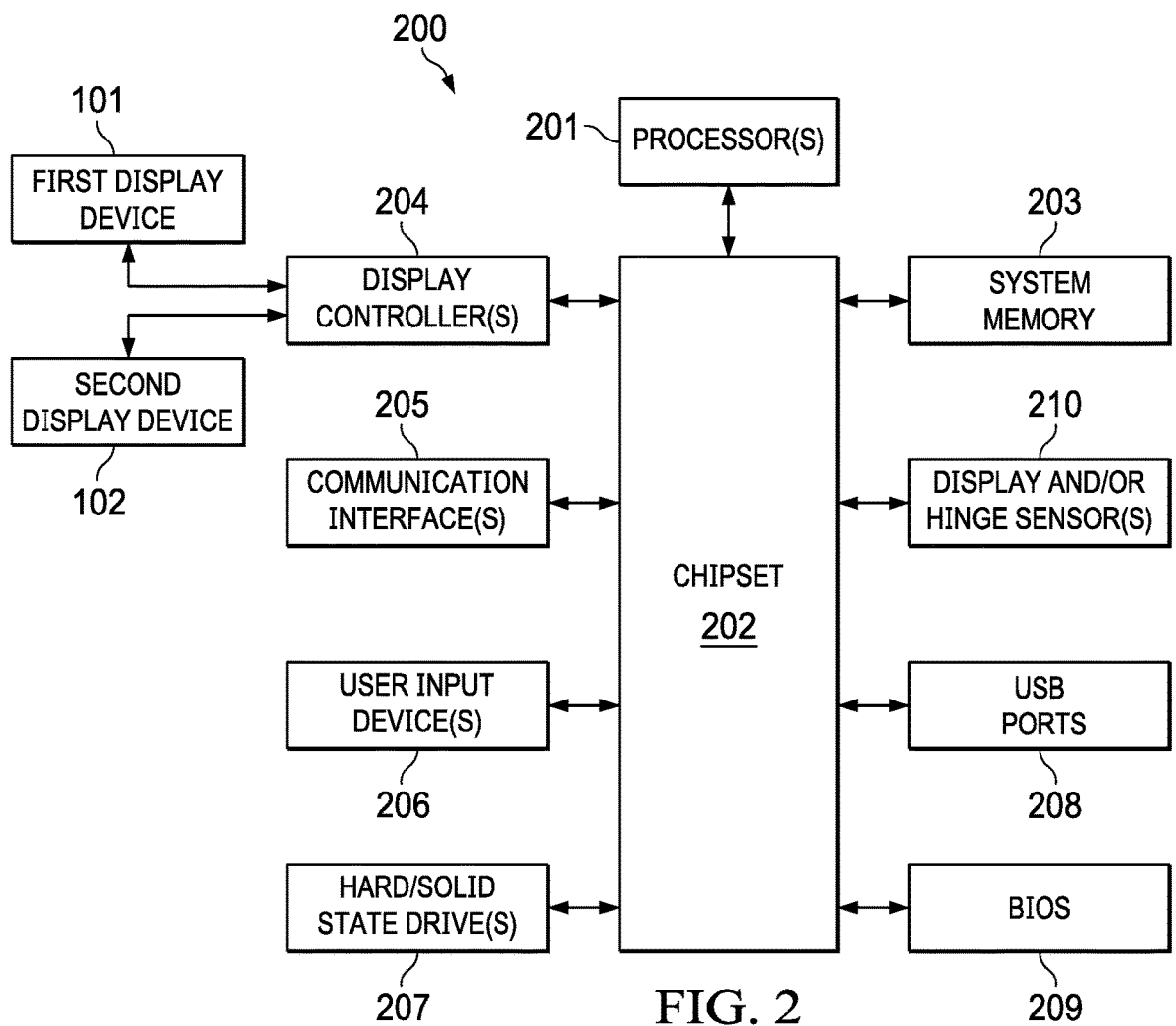
FIGS. 2 and 3 are block diagrams of components of the multi-form factor IHS and removable keyboard, respectively, according to some embodiments.

FIG. 2 is a block diagram of components 200 of multi-form factor IHS 100. As depicted, components 200 include processor 201. In various embodiments, IHS 100 may be a single-processor system, or a multi-processor system including two or more processors. Processor 201 may include any processor capable of executing program instructions, such as a PENTIUM series processor, or any general-purpose or embedded processors implementing any of a variety of Instruction Set Architectures (ISAs), such as an x86 ISA or a Reduced Instruction Set Computer (RISC) ISA (e.g., POWERPC, ARM, SPARC, MIPS, etc.).

IHS 100 includes chipset 202 coupled to processor 201. In certain embodiments, chipset 202 may utilize a QuickPath Interconnect (QPI) bus to communicate with processor 201. In various embodiments, chipset 202 may provide processor 201 with access to a number of resources. Moreover, chipset 202 may be coupled to communication interface(s) 205 to enable communications via various wired and/or wireless networks, such as Ethernet, WiFi, BLUETOOTH, cellular or mobile networks (e.g., CDMA, TDMA, LTE, etc.), satellite networks, or the like. For example, communication interface(s) 205 may be coupled to chipset 202 via a PCIe bus.

Chipset 202 may be coupled to display controller(s) 204, which may include one or more graphics processor(s) (GPUs) on a graphics bus, such as an Accelerated Graphics Port (AGP) or Peripheral Component Interconnect Express (PCIe) bus. As shown, display controller(s) 204 provide video or display signals to first display device 101 and second display device 202. In other implementations, any number of display controller(s) 204 and/or display devices 101/102 may be used.

Each of display devices 101 and 102 may include a flexible display that is deformable (e.g., bent, folded, rolled, or stretched) by an external force applied thereto. For example, display devices 101 and 102 may include LCD, OLED, or AMOLED, plasma, electrophoretic, or electrowetting panel(s) or film(s). Each display device 101 and 102 may include a plurality of pixels arranged in a matrix, configured to display visual information, such as text, two-dimensional images, video, three-dimensional images, etc.

Display device(s) 101/102 may be configured to sense haptic and/or physical touch events, and to generate touch information. To this end, display device(s) 101/102 may include a touchscreen matrix (e.g., a layered capacitive panel or the like) and/or touch controller configured to receive and interpret multi-touch gestures from a user touching the screen with a stylus or one or more fingers. In some cases, display and touch control aspects of display device(s) 101/102 may be collectively operated and controlled by display controller(s) 204.

In some cases, display device(s) 101/102 may also comprise a deformation or bending sensor configured to generate deformation or bending information including, but not limited to: the bending position of a display (e.g., in the form of a "bending line" connecting two or more positions at which bending is detected on the display), bending direction, bending angle, bending speed, etc. In these implementations, display device(s) 101/102 may be provided as a single continuous display, rather than two discrete displays.

Chipset 202 may also provide processor 201 and/or display controller(s) 204 with access to memory 203. In various embodiments, system memory 203 may be implemented using any suitable memory technology, such as static RAM (SRAM), dynamic RAM (DRAM) or magnetic disks, or any nonvolatile/Flash-type memory, such as a solid-state drive (SSD) or the like. Memory 203 may store program instructions that, upon execution by processor 201 and/or controller(s) 204, present a UI interface to a user of IHS 100.

Chipset 202 may further provide access to one or more hard disk and/or solid-state drives 207. In certain embodiments, chipset 202 may also provide access to one or more optical drives or other removable-media drives. In certain embodiments, chipset 202 may also provide access to one or more Universal Serial Bus (USB) ports 208.

Upon booting of IHS 100, processor(s) 201 may utilize Basic Input/Output System (BIOS) 209 instructions to initialize and test hardware components coupled to IHS 100 and to load an Operating System (OS) for use by IHS 100. BIOS 209 provides an abstraction layer that allows the OS to interface with certain hardware components that are utilized by IHS 100. Via the hardware abstraction layer provided by BIOS 209, software stored in memory 203 and executed by the processor(s) 201 of IHS 100 is able to interface with certain I/O devices that are coupled to the IHS 100. The Unified Extensible Firmware Interface (UEFI) was designed as a successor to BIOS. As a result, many modern IHSs utilize UEFI in addition to or instead of a BIOS. As used herein, BIOS is intended to also encompass UEFI.

Chipset 202 may also provide access to one or more user input devices 206, for example, using a super I/O controller or the like. For instance, chipset 202 may provide access to a keyboard (e.g., keyboard 103), mouse, trackpad, stylus, totem, or any other peripheral input device, including touchscreen displays 101 and 102. These input devices may interface with chipset 202 through wired connections (e.g., in the case of touch inputs received via display controller(s) 204) or wireless connections (e.g., via communication interfaces(s) 205). In some cases, chipset 202 may be used to interface with user input devices such as keypads, biometric scanning devices, and voice or optical recognition devices.

In certain embodiments, chipset 202 may also provide an interface for communications with one or more sensors 210. Sensors 210 may be disposed within displays 101/102 and/or hinge 104, and may include, but are not limited to: electric, magnetic, radio, optical, infrared, thermal, force, pressure, acoustic, ultrasonic, proximity, position, deformation, bending, direction, movement, velocity, rotation, and/or acceleration sensor(s).

Figure 3:
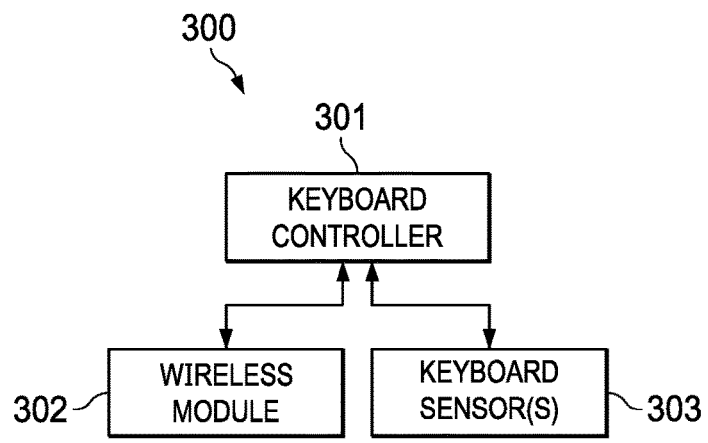

FIG. 3 is a block diagram of components 300 of keyboard 103. As depicted, components 300 include keyboard controller or processor 301, coupled to keyboard sensor(s) 303 and wireless communication module 302. In various embodiments, keyboard controller 301 may be configured to detect keystrokes made by user upon a keyboard matrix, and it may transmit those keystrokes to IHS 100 via wireless module 302 using a suitable protocol (e.g., BLUETOOTH). Keyboard sensors 303, which may also include any of the aforementioned types of sensor(s), may be disposed under keys and/or around the keyboard's enclosure, to provide information regarding the location, arrangement, or status of keyboard 103 to IHS 100 via wireless module 302. In other implementations, however, one or more keyboard sensors 303 (e.g., one or more Hall effect sensors, a magnetometer, etc.) may be disposed within first and/or second displays 101/102.

In some cases, a magnetic attachment and alignment system(s) may enable keyboard 103 to be attached to second display 102 (on the display surface, or on the back of display 102), and/or to be aligned on/off the surface of display 102, at predetermined locations. Moreover, display and/or hinge sensors 210 may be configured to determine which of a plurality of magnetic devices are presently engaged, so that the current position of keyboard 103 may be ascertained with respect to IHS 100. For example, keyboard 103 may have magnetic devices disposed along its short sides at selected locations. Moreover, second display 102 may include magnetic devices at locations that correspond to the keyboard's magnetic devices, and which snap keyboard 103 into any number of predetermined locations over the display surface of second display 102 alongside its short sides.

In various embodiments, systems and methods for on-screen keyboard detection may include a "fixed-position via Hall sensors" solution implemented as hardware/firmware that reads the multiple Hall sensors' information, calculates where a keyboard is detected, and sends the keyboard location (fixed positions) information to an OS. Additionally, or alternatively, these systems and methods may include a "variable-position via Hall sensors" solution implemented as hardware/firmware that reads a single Hall sensor's information based on the variable Gauss value of magnet(s) on keyboard 103.

Additionally, or alternatively, these systems and methods may include a "variable position via magnetometer" solution implemented as hardware/firmware that reads a single magnetometer's information based the relative location a single magnet on keyboard 103. Additionally, or alternatively, these systems and methods may include a "variable position via 3D Hall sensor" solution implemented as hardware/firmware that reads a 3D Hall sensor's information based the relative location a programmed magnet (different polarities) or array of magnets in different orientations on keyboard 103.

In some cases, by using magnetic keyboard detection, instead of relying upon touch sensors or the digitizer built into display 102, systems and methods described herein may be made less complex, using less power and fewer compute resources. Moreover, by employing a separate magnetic sensing system, IHS 100 may turn off touch in selected areas of display 102 such as, for example, in the areas of display 102 covered by keyboard 103.

In various embodiments, IHS 100 and/or keyboard 103 may not include all of components 200 and/or 300 shown in FIGS. 2 and 3, respectively. Additionally, or alternatively, IHS 100 and/or keyboard 103 may include components in addition to those shown in FIGS. 2 and 3, respectively. Additionally, or alternatively, components 200 and/or 300, represented as discrete in FIGS. 2 and 3, may be integrated with other components. For example, all or a portion of the functionality provided by components 200 and/or 300 may be provided as a System-On-Chip (SOC), or the like.

Figure 4:
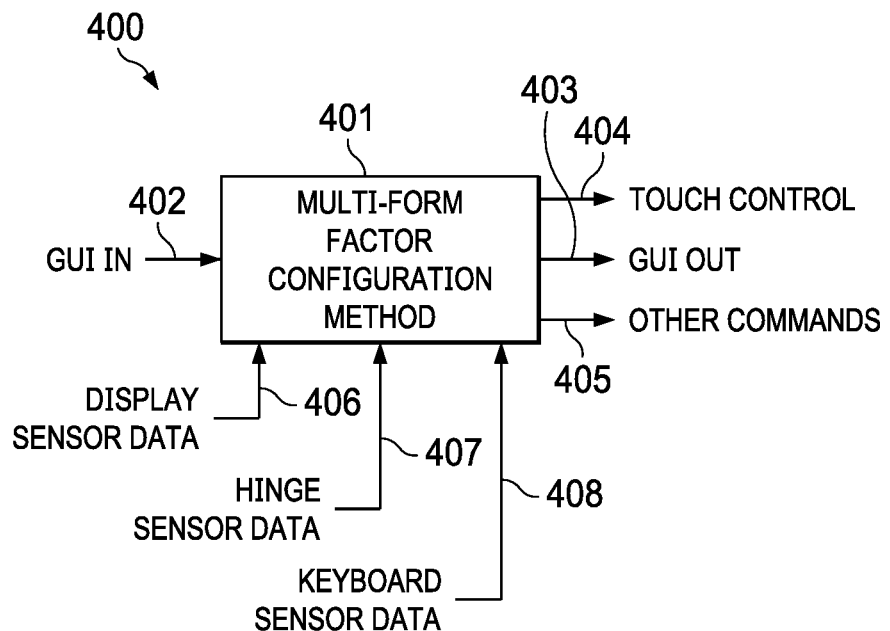
FIG. 4 is a block diagram of a multi-form factor configuration engine, according to some embodiments.

FIG. 4 is a block diagram of multi-form factor configuration engine 401. Particularly, multi-form factor configuration engine 401 may include electronic circuits and/or program instructions that, upon execution, cause IHS 100 to perform a number of operation(s) and/or method(s) described herein.

In various implementations, program instructions for executing multi-form factor configuration engine 401 may be stored in memory 203. For example, engine 401 may include one or more standalone software applications, drivers, libraries, or toolkits, accessible via an Application Programming Interface (API) or the like. Additionally, or alternatively, multi-form factor configuration engine 401 may be included the IHS's OS.

In other embodiments, however, multi-form factor configuration engine 401 may be implemented in firmware and/or executed by a co-processor or dedicated controller, such as a Baseband Management Controller (BMC), or the like.

As illustrated, multi-form factor configuration engine 401 receives Graphical User Interface (GUI) input or feature 402, and produces GUI output or feature 403, in response to receiving and processing one or more or: display sensor data 406, hinge sensor data 407, and/or keyboard sensor data 408. Additionally, or alternatively, multi-form factor configuration engine 401 may produce touch control feature 404 and/or other commands 405.

In various embodiments, GUI input 402 may include one or more images to be rendered on display(s) 101/102, and/or one or more entire or partial video frames. Conversely, GUI output 403 may include one or more modified images (e.g., different size, color, position on the display, etc.) to be rendered on display(s) 101/102, and/or one or more modified entire or partial video frames.

For instance, in response to detecting, via display and/or hinge sensors 406/407, that IHS 100 has assumed a laptop posture from a closed or "off" posture, GUI OUT 403 may allow a full-screen desktop image, received as GUI IN 402, to be displayed first display 101 while second display 102 remains turned off or darkened. Upon receiving keyboard sensor data 408 indicating that keyboard 103 has been positioned over second display 102, GUI OUT 403 may produce a ribbon-type display or area 106 around the edge(s) of keyboard 103, for example, with interactive and/or touch selectable virtual keys, icons, menu options, pallets, etc. If keyboard sensor data 408 then indicates that keyboard 103 has been turned off, for example, GUI OUT 403 may produce an OSK on second display 102.

Additionally, or alternatively, touch control feature 404 may be produced to visually delineate touch input area 107 of second display 102, to enable its operation as a user input device, and to thereby provide an UI interface commensurate with a laptop posture. Touch control feature 404 may turn palm or touch rejection on or off in selected parts of display(s) 101/102. Also, GUI OUT 403 may include a visual outline displayed by second display 102 around touch input area 107, such that palm or touch rejection is applied outside of the outlined area, but the interior of area 107 operates as a virtual trackpad on second display 102.

Multi-form factor configuration engine 401 may also produce other commands 405 in response to changes in display posture and/or keyboard state or arrangement, such as commands to turn displays 101/102 on or off, enter a selected power mode, charge or monitor a status of an accessory device (e.g., docked in hinge 104), etc.

Figure 5:
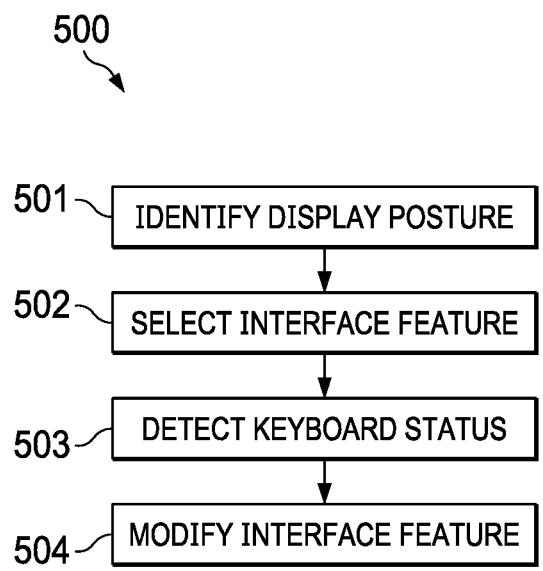
FIG. 5 is a flowchart of a method for configuring multi-form factor IHSs, according to some embodiments.

FIG. 5 is a flowchart of method 500 for configuring multi-form factor IHSs. In various embodiments, method 500 may be performed by multi-form factor configuration engine 401 under execution of processor 201. At block 501, method 500 includes identifying a display posture—that is, a relative physical arrangement between first display 101 and second display 102. For example, block 501 may use sensor data received from displays 101/102 and/or hinge 104 to distinguish among the various postures shown below.

At block 502, method 500 selects a UI feature corresponding to the identified posture. Examples of UI features include, but are not limited to: turning a display on or off; displaying a full or partial screen GUI; displaying a ribbon area; providing a virtual trackpad area; altering touch control or palm rejection settings; adjusting the brightness and contrast of a display; selecting a mode, volume, and/or or directionality of audio reproduction; etc.

At block 503, method 500 may detect the status of keyboard 103. For example, block 503 may determine that keyboard 103 is on or off, resting between two closed displays, horizontally sitting atop display(s) 101/102, or next to display(s) 101/102. Additionally, or alternatively, block 503 may determine the location or position of keyboard 103 relative to display 102, for example, using Cartesian coordinates. Additionally, or alternatively, block 503 may determine an angle between keyboard 103 and displays 101/102 (e.g., a straight angle if display 102 is horizontal, or a right angle if display 102 is vertical).

Then, at block 504, method 500 may modify the UI feature in response to the status of keyboard 103. For instance, block 504 may cause a display to turn on or off, it may change the size or position of a full or partial screen GUI or a ribbon area, it may change the size or location of a trackpad area with changes to control or palm rejection settings, etc. Additionally, or alternatively, block 504 may produce a new interface feature or remove an existing feature, associated with a display posture, in response to any aspect of the keyboard status meeting a selected threshold of falling within a defined range of values.

FIGS. 6A-C, 7A-J, 8A-D, and 9A-F illustrate examples of various display postures which may be detected by operation of block 501 of method 500 during execution of multi-form factor configuration engine 401 by IHS 100. In some implementations, different ranges of hinge angles may be mapped to different IHS postures as follows: closed posture (0 to 5 degrees), laptop or book posture (5 to 175 degrees), canvas posture (175 to 185 degrees), tent or stand posture (185 to 355 degrees), and/or tablet posture (355 to 360 degrees).

Figure 6A:
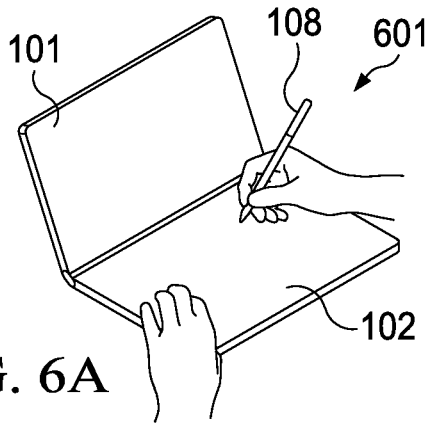
FIGS. 6A-C, 7A-J, 8A-D, and 9A-F illustrate examples of laptop, tablet, book, and display postures, respectively, according to some embodiments.
Figure 6B:
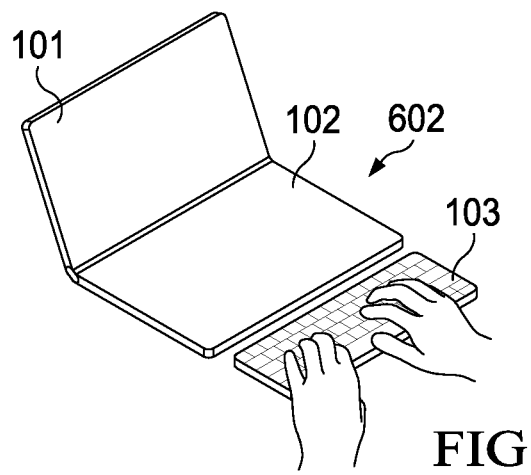
Figure 6C:
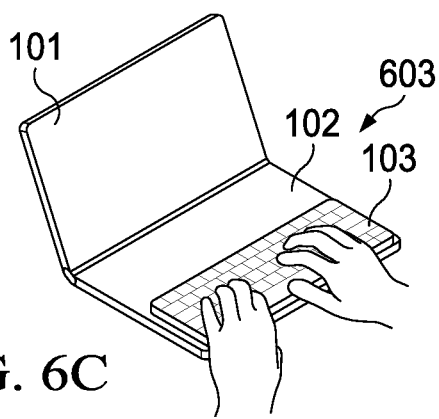

Particularly, FIGS. 6A-C show a laptop posture, where a first display surface of first display 101 is facing the user at an obtuse angle with respect to a second display surface of second display 102, and such that second display 102 is disposed in a horizontal position, with the second display surface facing up. In FIG. 6A, state 601 shows a user operating IHS 100 with a stylus or touch on second display 102. In FIG. 6B, state 602 shows IHS 100 with keyboard 103 positioned off the bottom edge or long side of second display 102, and in FIG. 6C, state 603 shows the user operating keyboard 103 atop second display 102.

Figure 7A:
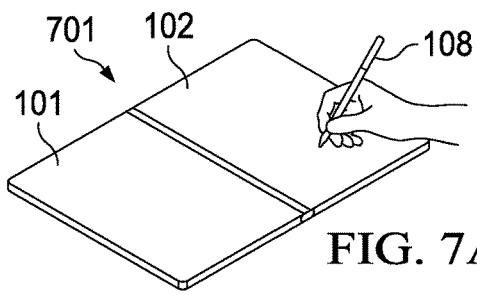
Figure 7B:
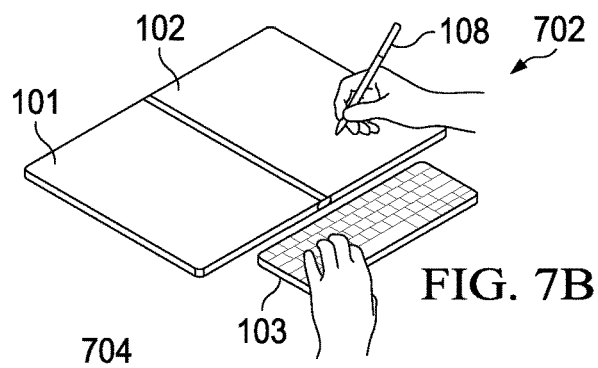
Figure 7C:
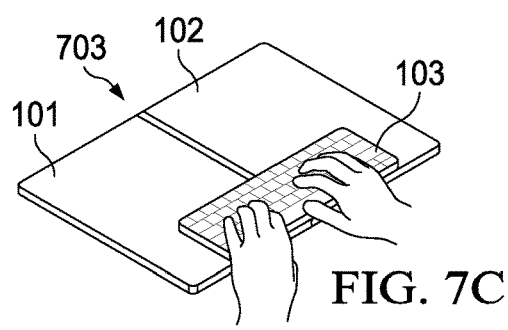
Figure 7D:
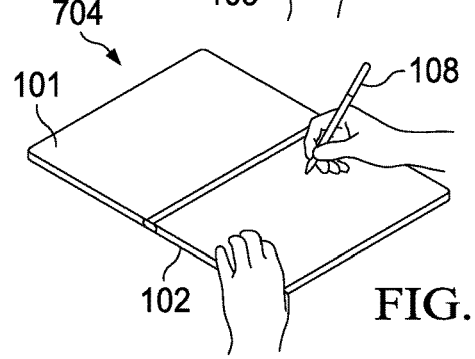
Figure 7E:
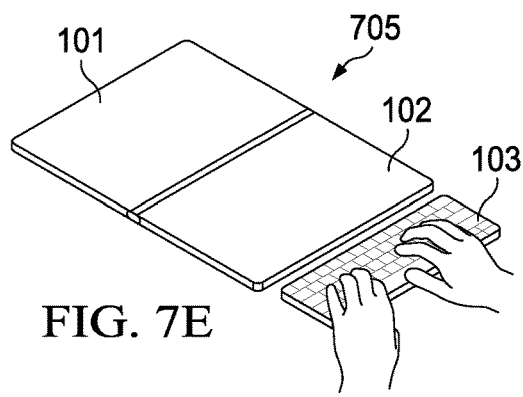
Figure 7F:
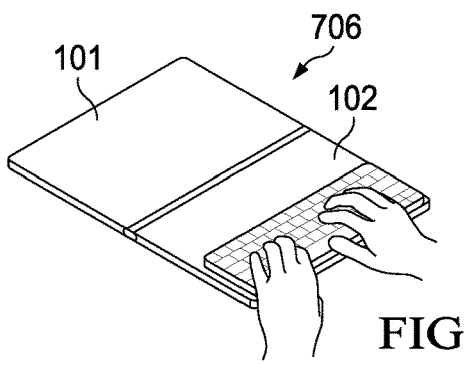

FIGS. 7A-J show a tablet posture, where first display 101 is at a straight angle with respect to second display 102, such that first and second displays 101 and 102 are disposed in a horizontal position, with the first and second display surfaces facing up. Specifically, FIG. 7A shows state 701 where IHS 100 is in a side-by-side, portrait orientation without keyboard 103, FIG. 7B shows state 702 where keyboard 103 is being used off the bottom edges or short sides of display(s) 101/102, and FIG. 7C shows state 703 where keyboard 103 is located over both displays 101 and 102. In FIG. 7D, state 704 shows IHS 100 in a side-by-side, landscape configuration without keyboard 103, in FIG. 7E state 705 shows keyboard 103 being used off the bottom edge or long side of second display 102, and in FIG. 7F state 706 shows keyboard 103 on top of second display 102.

Figure 7G:
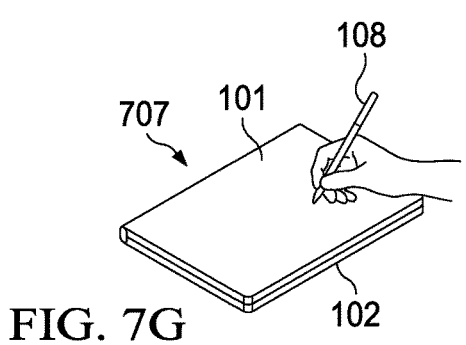
Figure 7H:
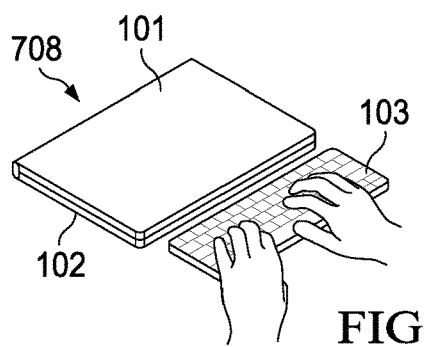
Figure 7I:
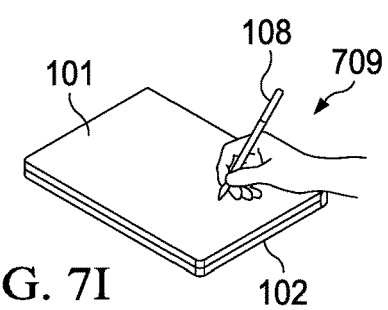
Figure 7J:
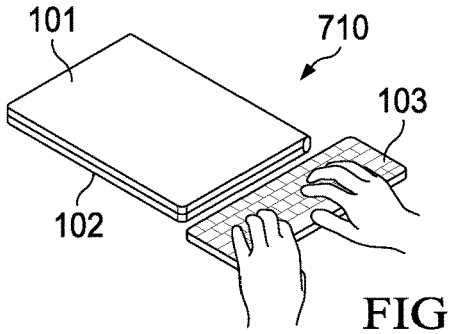

In FIG. 7G, state 707 shows first display 101 rotated around second display 102 via hinge 104 such that the display surface of second display 102 is horizontally facing down, and first display 101 rests back-to-back against second display 102, without keyboard 103; and in FIG. 7H, state 708 shows the same configuration, but with keyboard 103 placed off the bottom or long edge of display 102. In FIGS. 7I and 7J, states 709 and 710 correspond to states 707 and 708, respectively, but with IHS 100 in a portrait orientation.

Figure 8A:
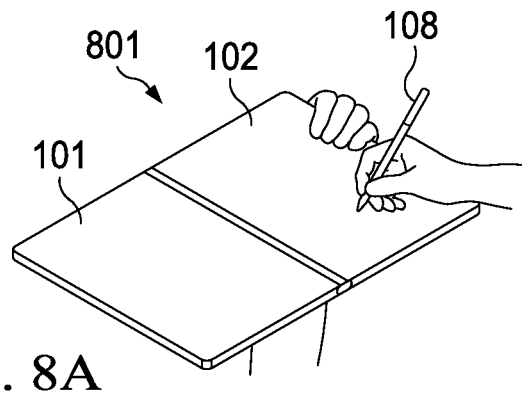
Figure 8B:
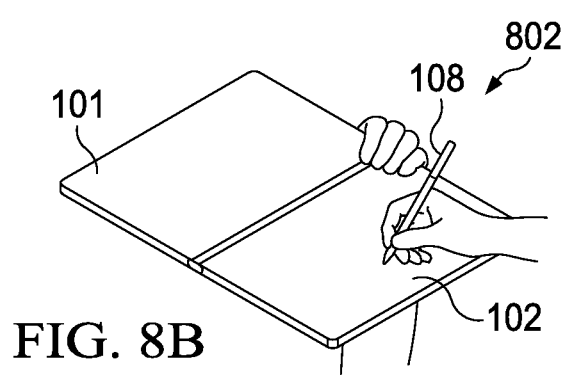
Figure 8C:
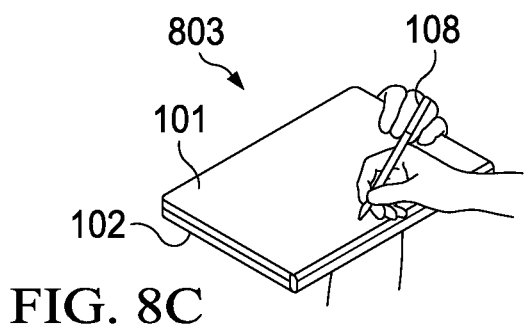
Figure 8D:
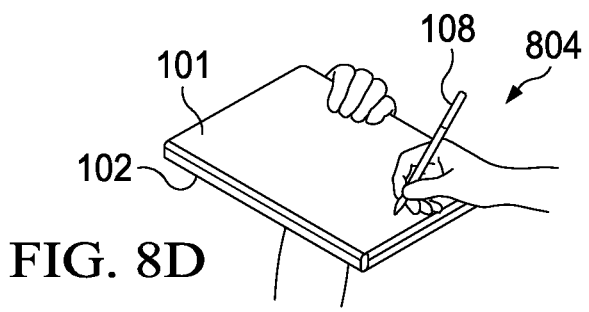
Figure 9A:
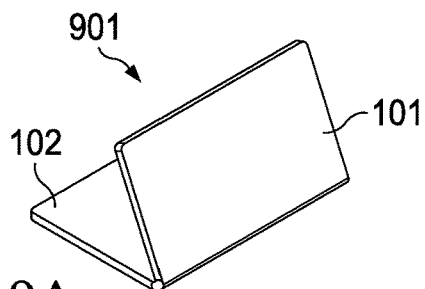
Figure 9B:
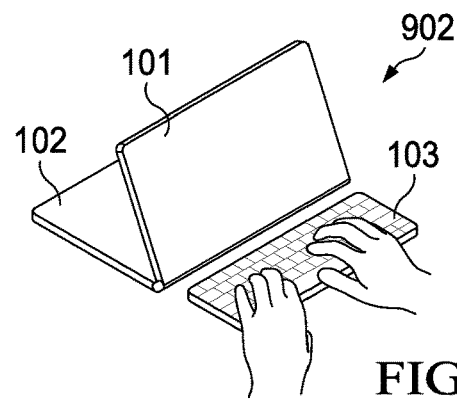

FIG. 8A-D show a book posture, similar to the tablet posture of FIGS. 7A-J, but such that neither one of displays 101 or 102 is horizontally held by the user and/or such that the angle between the display surfaces of the first and second displays 101 and 102 is other than a straight angle. In FIG. 8A, state 801 shows dual-screen use in portrait orientation, in FIG. 8B state 802 shows dual-screen use in landscape orientation, in FIG. 8C state 803 shows single-screen use in landscape orientation, and in FIG. 8D state 804 shows single-screen use in portrait orientation.

Figure 9C:
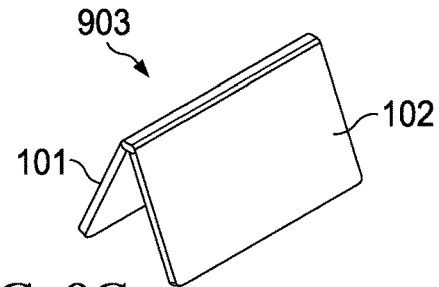
Figure 9D:
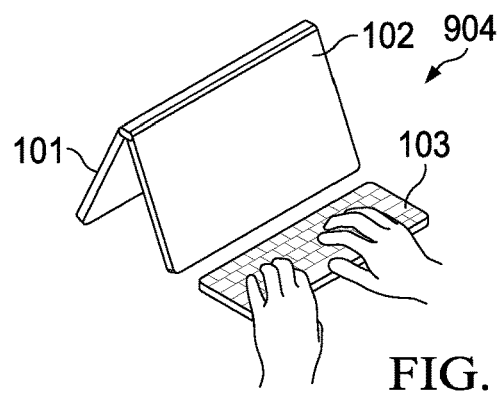
Figure 9E:
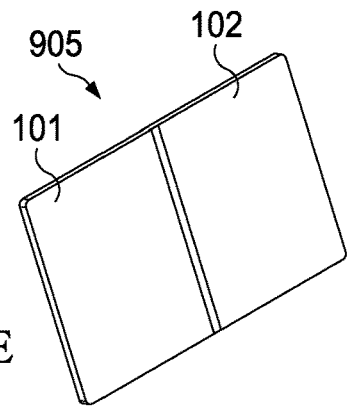
Figure 9F:
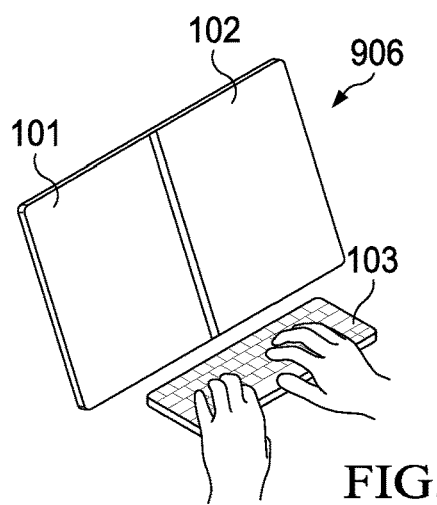

FIGS. 9A-F show a display posture, where first display 100 is at an acute angle with respect to second display 102, and/or where both displays are vertically arranged in a portrait orientation. Particularly, in FIG. 9A state 901 shows a first display surface of first display 102 facing the user and the second display surface of second display 102 horizontally facing down in a stand configuration ("stand"), whereas in FIG. 9B state 902 shows the same stand configuration but with keyboard 103 used off the bottom edge or long side of display 101. In FIG. 9C, state 903 shows a display posture where display 102 props up display 101 in a tent configuration ("tent"), and in FIG. 9D, state 904 shows the same tent configuration but with keyboard 103 used off the bottom edge or long side of display 101. In FIG. 9E, state 905 shows both displays 101 and 102 resting vertically or at display angle ("dual-display mode"), and in FIG. 9F state 906 shows the same configuration but with keyboard 103 used off the bottom edge or long side of display 101.

It should be noted that the aforementioned postures, and their various respective keyboard states, are described for sake of illustration. In different embodiments, however, other postures and keyboard states may be used, for example, depending upon the type of hinge coupling the displays, the number of displays used, or other accessories. For instance, when IHS 100 is chargeable via a charging or dock, the connector in the dock may be configured to hold IHS 100 at angle selected to facility one of the foregoing postures (e.g., keyboard states 905 and 906).

FIGS. 10A-C illustrate a first example use-case of method 500 in the context of a laptop posture. In state 1000A of FIG. 10A, first display 101 shows primary display area 1001, keyboard 103 sits atop second display 102, and second display 102 provides UI features such as first ribbon area 1002 (positioned between the top long edge of keyboard 103 and hinge 104) and touch area 1003 (positioned below keyboard 103). As keyboard 103 moves up or down on the surface of display 102, ribbon area 1002 and/or touch area 1003 may dynamically move up or down, or become bigger or smaller, on second display 102. In some cases, when keyboard 103 is removed, a virtual OSK may be rendered (e.g., at that same location) on the display surface of display 102.

In state 1000B of FIG. 10B, in response to execution of method 500 by multi-form factor configuration engine 401, first display 101 continues to show main display area 1001, but keyboard 103 has been moved off of display 102. In response, second display 102 now shows secondary display area 1004 and also second ribbon area 1005. In some cases, second ribbon area 1005 may include the same UI features (e.g., icons, etc.) as also shown in area 1002, but here repositioned to a different location of display 102 nearest the long edge of keyboard 103. Alternatively, the content of second ribbon area 1005 may be different from the content of first ribbon area 1002.

In state 1000C of FIG. 100, during execution of method 500 by multi-form factor configuration engine 401, IHS 100 detects that physical keyboard 103 has been removed (e.g., out of wireless range) or turned off (e.g., low battery), and in response display 102 produces a different secondary display area 1006 (e.g., smaller than 1004), as well as OSK 1007.

FIGS. 11A-C illustrate a second example use-case of method 500 in the context of a tablet posture. In state 1100A of FIG. 11A, second display 102 has its display surface facing up, and is disposed back-to-back with respect to second display 102, as in states 709/710, but with keyboard 103 sitting atop second display 102. In this state, display 102 provides UI features such primary display area 1101 and first ribbon area 1102, positioned as shown. As keyboard 103 is repositioned up or down on the surface of display 102, display area 1101, first ribbon area 1102, and/or touch area 1103 may also be moved up or down, or made bigger or smaller, by multi-form factor configuration engine 401.

In state 1100B of FIG. 11B, keyboard 103 is detected off of the surface of display 102. In response, first display 101 shows modified main display area 1103 and modified ribbon area 1104. In some cases, modified ribbon area 1104 may include the same UI features as area 1102, but here repositioned to a different location of display 102 nearest the long edge of keyboard 103. Alternatively, the content of second ribbon area 1104 may be different from the content of first ribbon area 1102. In some cases, the content and size of modified ribbon area 1104 may be selected in response to a distance between keyboard 103 and display 102.

In state 1100C of FIG. 11C, during continued execution of method 500, multi-form factor configuration engine 401 detects that physical keyboard 103 has been removed or turned off, and in response display 102 produces yet another display area 1105 (e.g., larger than 1003 or 1002), this time without an OSK.

In various embodiments, the different UI behaviors discussed in the aforementioned use-cases may be set, at least in part, by policy and/or profile, and stored in a preferences database for each user. In this manner, UI features and modifications of blocks 502 and 504, such as whether touch input area 1003 is produced in state 1000A (and/or its size and position on displays 101/102), or such as whether ribbon area 1102 is produced in state 1100A (and/or its size and position on displays 101/102), may be configurable by a user.

FIGS. 12A-D illustrate a 360-hinge implementation, usable as hinge 104 in IHS 100, in four different configurations 1200A-D, respectively. Particularly, 360-hinge 104 may include a plastic, acrylic, polyamide, polycarbonate, elastic, and/or rubber coupling, with one or more internal support, spring, and/or friction mechanisms that enable a user to rotate displays 101 and 102 with respect to one another, around the axis of 360-hinge 104.

Hinge configuration 1200A of FIG. 12A may be referred to as a closed posture, where at least a portion of a first display surface of the first display 101 is disposed against at least a portion of a second display surface of the second display 102, such that the space between displays 101/102 accommodates keyboard 103. When display 101 is against display 102, stylus or accessory 108 may be slotted into keyboard 103. In some cases, stylus 108 may have a diameter larger than the height of keyboard 103, so that 360-hinge 104 wraps around a portion of the circumference of stylus 108 and therefore holds keyboard 103 in place between displays 101/102.

Hinge configuration 1200B of FIG. 12B shows a laptop posture between displays 101/102. In this case, 360-hinge 104 holds first display 101 up, at an obtuse angle with respect to first display 101. Meanwhile, hinge configuration 1200C of FIG. 12C shows a tablet, book, or display posture (depending upon the resting angle and/or movement of IHS 100), with 360-hinge 104 holding first and second displays 101/102 at a straight angle (180°) with respect to each other.

And hinge configuration 1200D of FIG. 12D shows a tablet or book configuration, with 360-hinge 104 holding first and second displays 101 and 102 at a 360° angle, with their display surfaces in facing opposite directions.

Figure 13A:
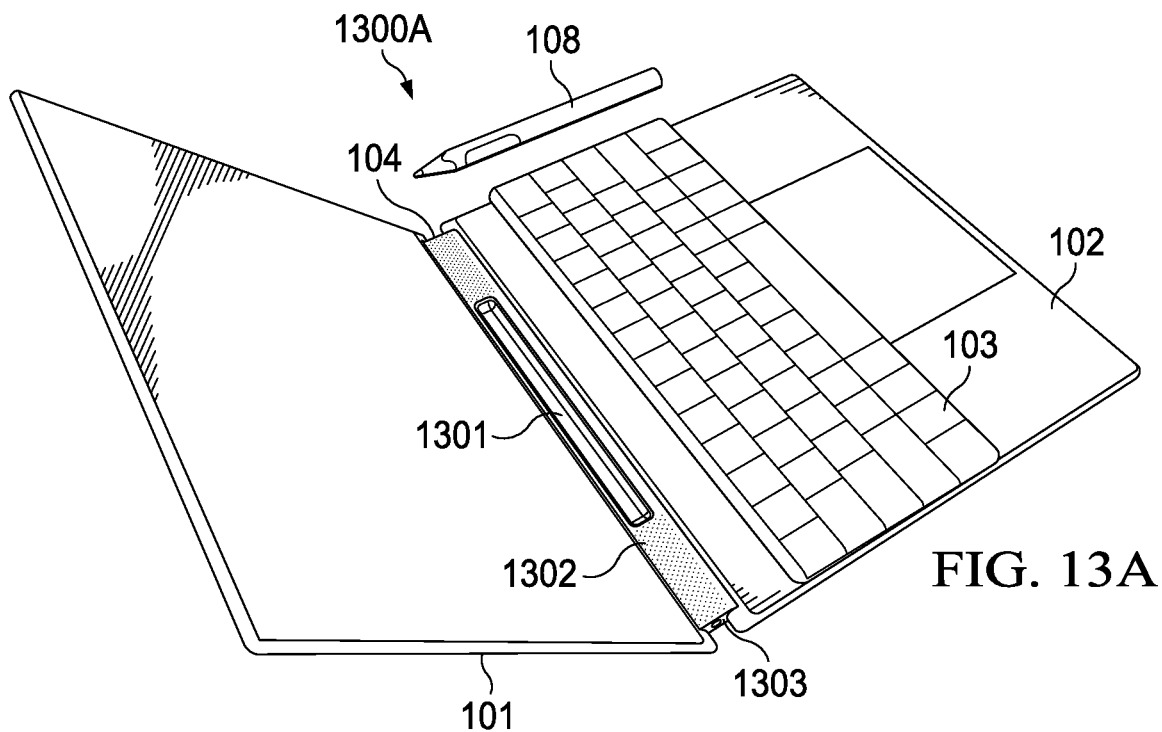
Figure 13B:
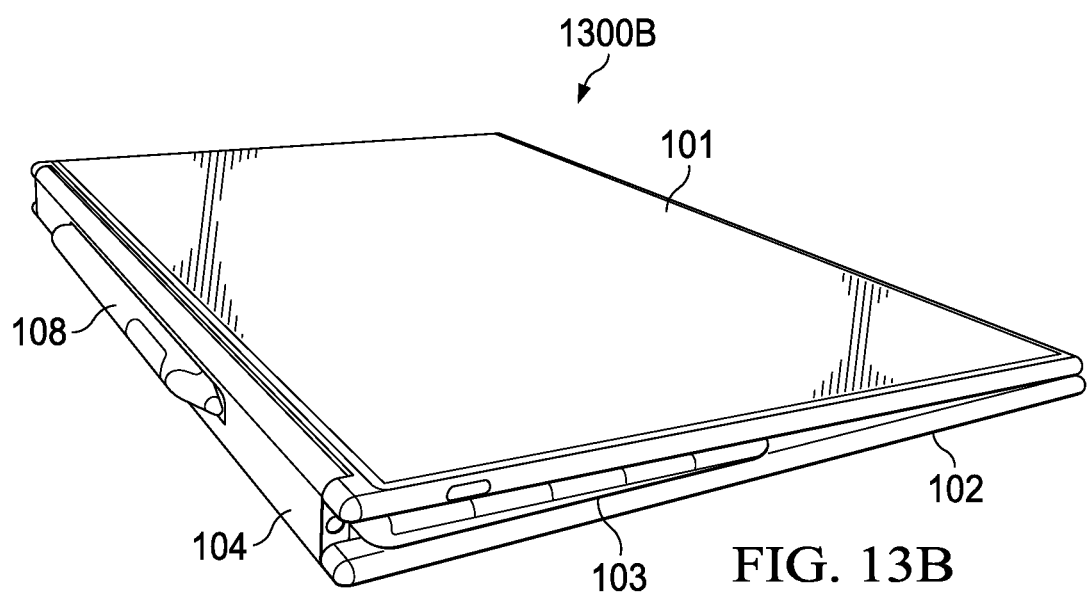

FIGS. 13A and 13B illustrate a jaws hinge implementation, usable as hinge 104 in IHS 100, in two different configurations 1300A and 1300B. Specifically, jaws hinge 104 has two rotation axes, parallel to each other, one axis for each respective one of displays 101/102. A solid bar element 104 between the two rotation axes may be configured to accommodate docking compartment 1301 for stylus 108, audio speaker(s) 1302 (e.g., monaural, stereo, a directional array), and one or more ports 1303 (e.g., an audio in/out jack).

Hinge configuration 1300A of FIG. 13A shows the laptop posture. In this case, jaws hinge 104 holds first display 101 up, at an obtuse angle with respect to second display 102. In contrast, hinge configuration 1300B of FIG. 13B shows a tablet or book posture, with jaws hinge 104 holding first and second displays 101 and 102 at a 360° angle with respect to each other, with keyboard 103 stored in between displays 101 and 102, in a back-to-back configuration, such that stylus 108 remains accessible to the user.

Figure 14:
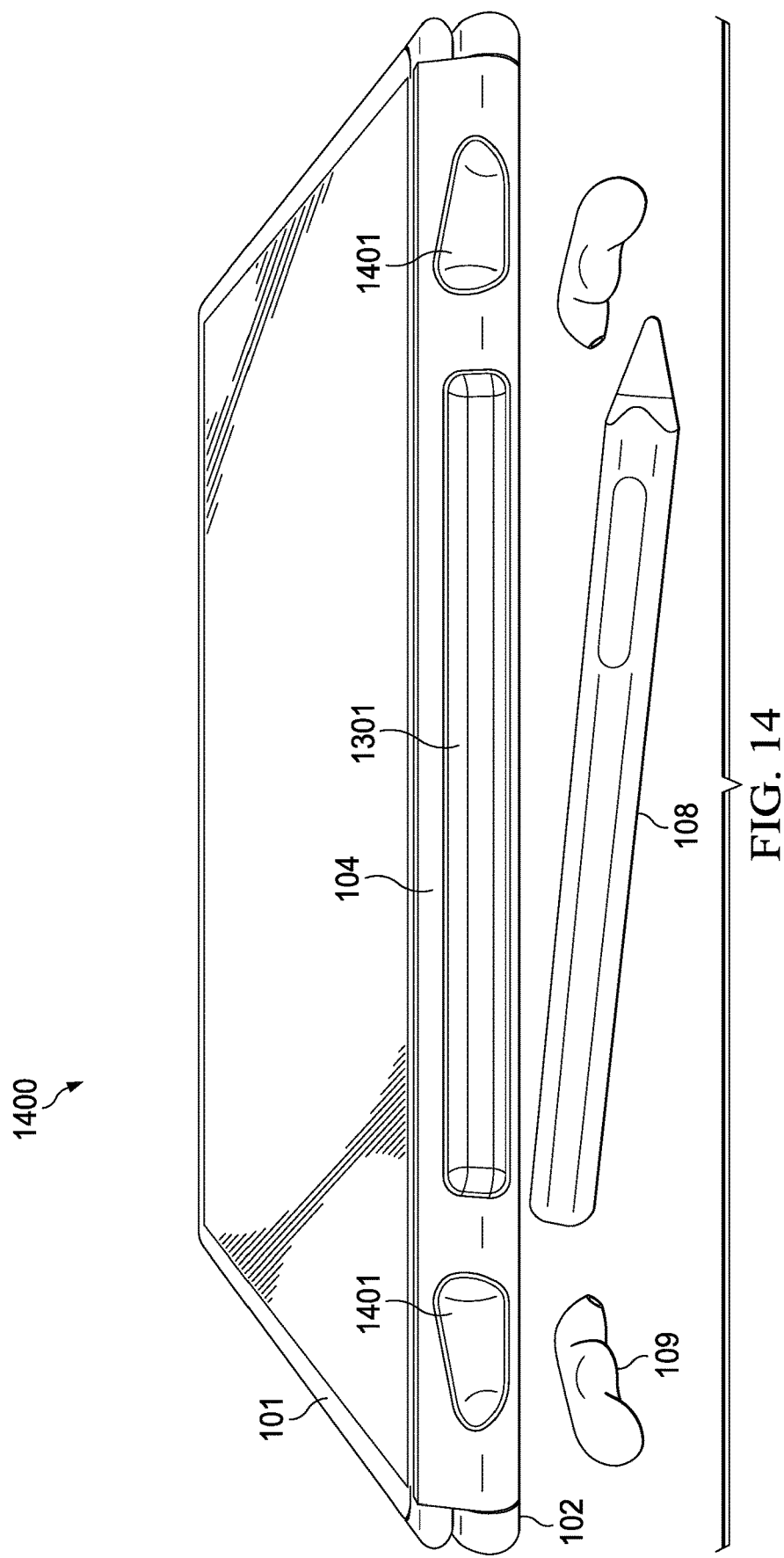
FIG. 14 illustrates an accessory charging system, according to some embodiments.

FIG. 14 illustrates accessory charging system 1400, with accessory wells 1301 and 1401 shown on hinge 104 that couples first display 101 to second display 102. In various embodiments, accessory wells 1301 and 1401 may be formed of molded or extruded plastic. In this example, accessory well 1301 is shaped to hold pen or stylus 108, and accessory well 1401 is shaped to hold earbud 109. In some implementations, wells 1301 and/or 1401 may include electrical terminals for charging a battery within the accessory, and/or to check a status of the accessory (e.g., presence, charge level, model or name, etc.).

Figure 15:
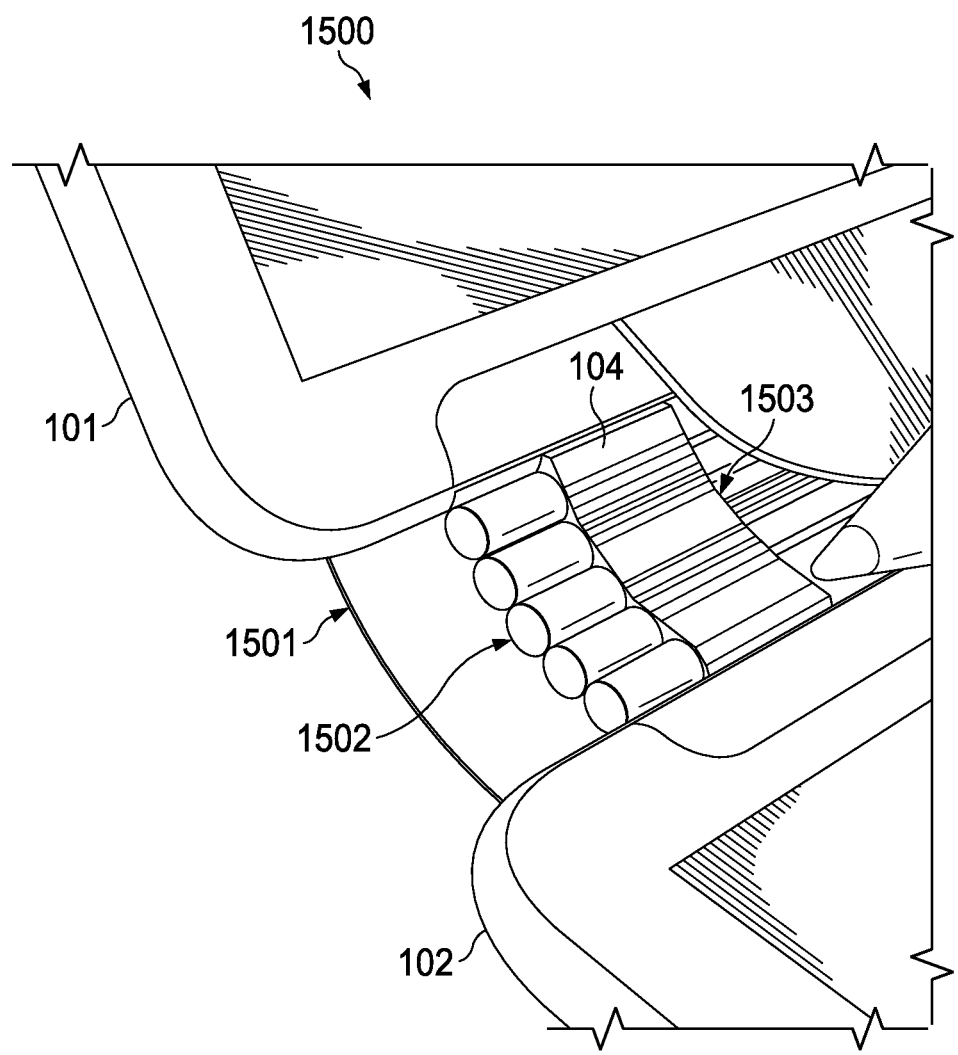
FIGS. 15, 16A-C, 17A, and 17B illustrate a third hinge implementation, a fourth hinge implementation, and a fifth hinge implementation, respectively, according to some embodiments.

FIG. 15 illustrates a watchband hinge implementation, usable as hinge 104 in IHS 100, in configuration 1500. Specifically, watchband hinge 104 comprises a plurality of metal cylinders or rods, with axes parallel to each other, held together by bracket 1503 and/or fabric 1501. In operation, bracket 1503 may include notches and/or detents configured to hold cylinders 1502 at predetermined positions corresponding to any available IHS posture.

Figure 16B:
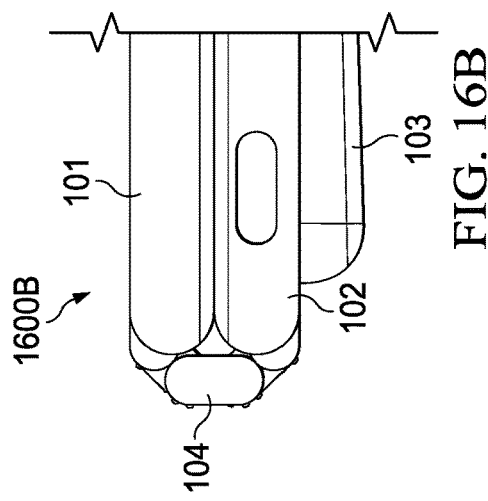
Figure 16C:
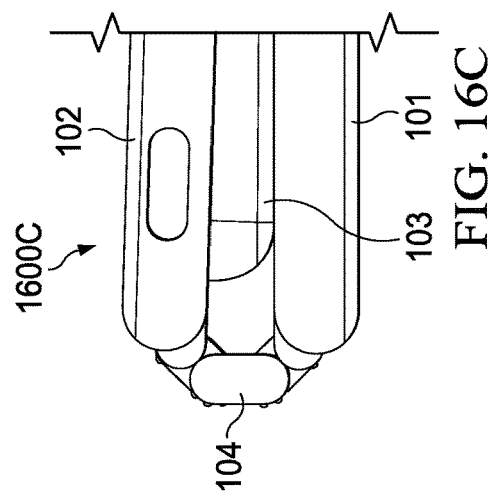
Figure 16A:
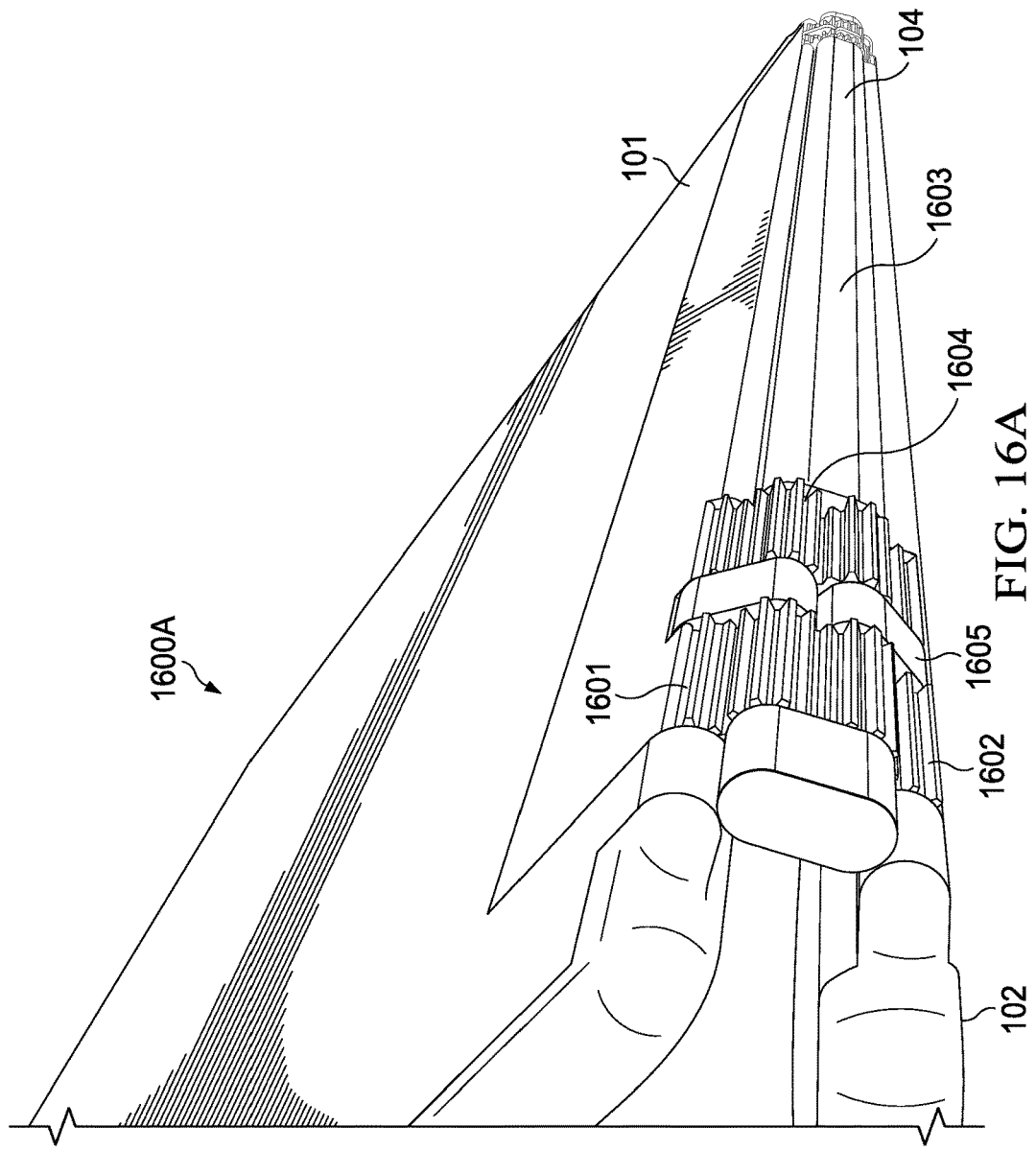
Figure 17B:
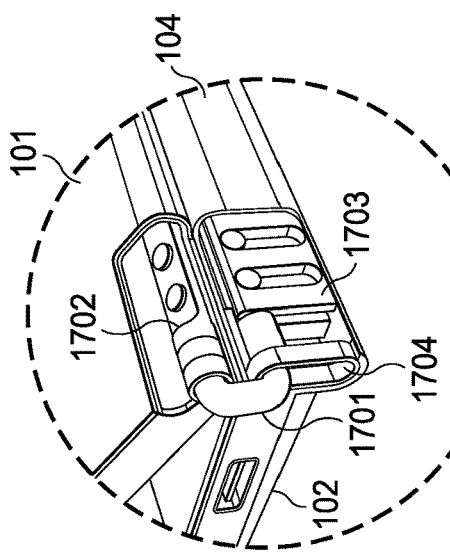
Figure 17A:
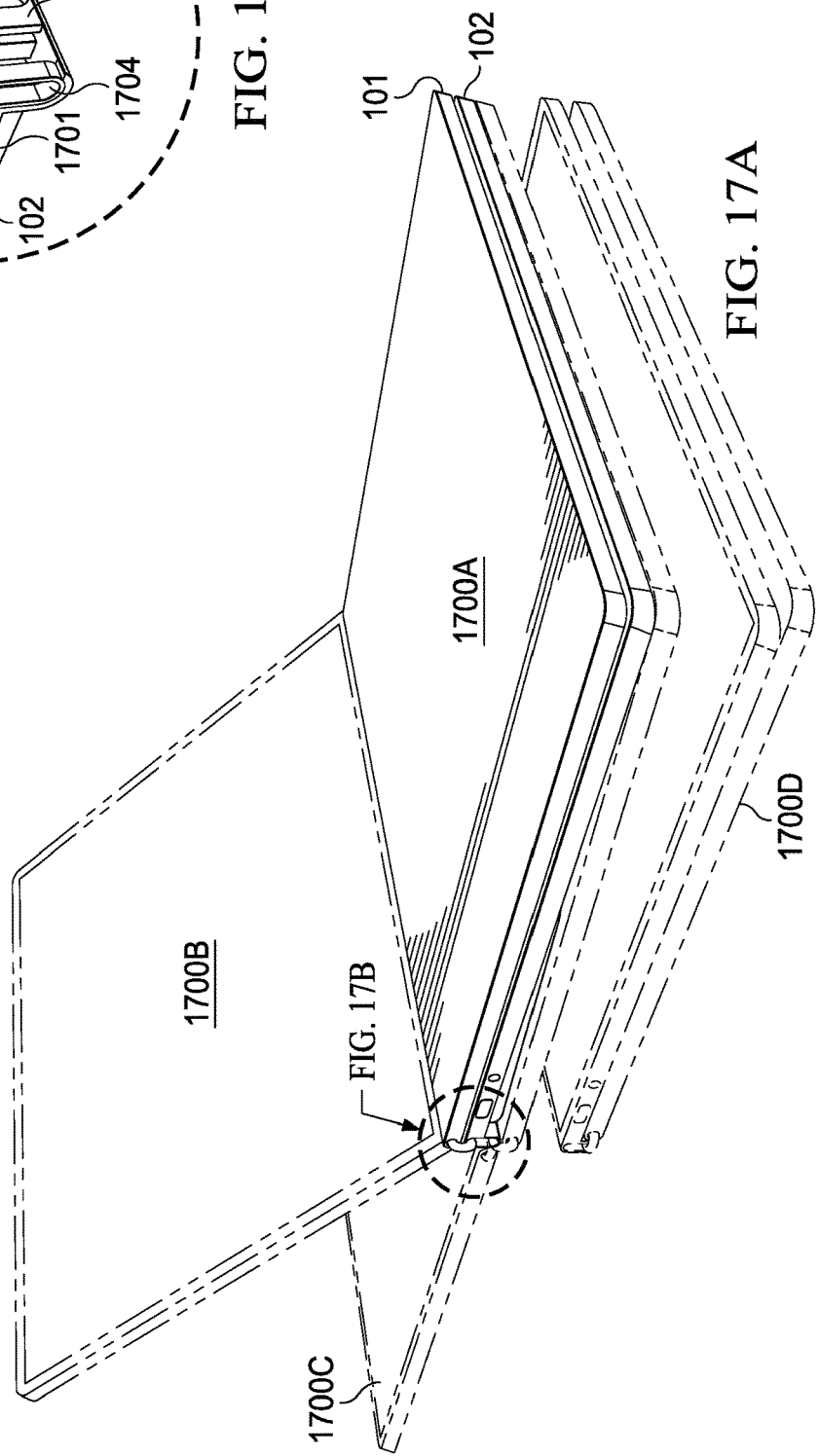

FIGS. 16A-C illustrate a gear hinge implementation, usable as hinge 104 in IHS 100, in configurations 1600A-C. Specifically, configuration 1600A of FIG. 16A shows gear hinge 104 with bar 1603 having teeth or gears 1604 fabricated thereon, as IHS 100 begins to assume a laptop posture. Display 101 has teeth or gears 1601 alongside its bottom edge, whereas display 102 has teeth or gears 1602 alongside its top edge. Bracket(s) 1605 hold gears 1601 and/or 1602 against gear 1604, therefore provides two parallel rotation axes between displays 101 and 102.

Figure 19:
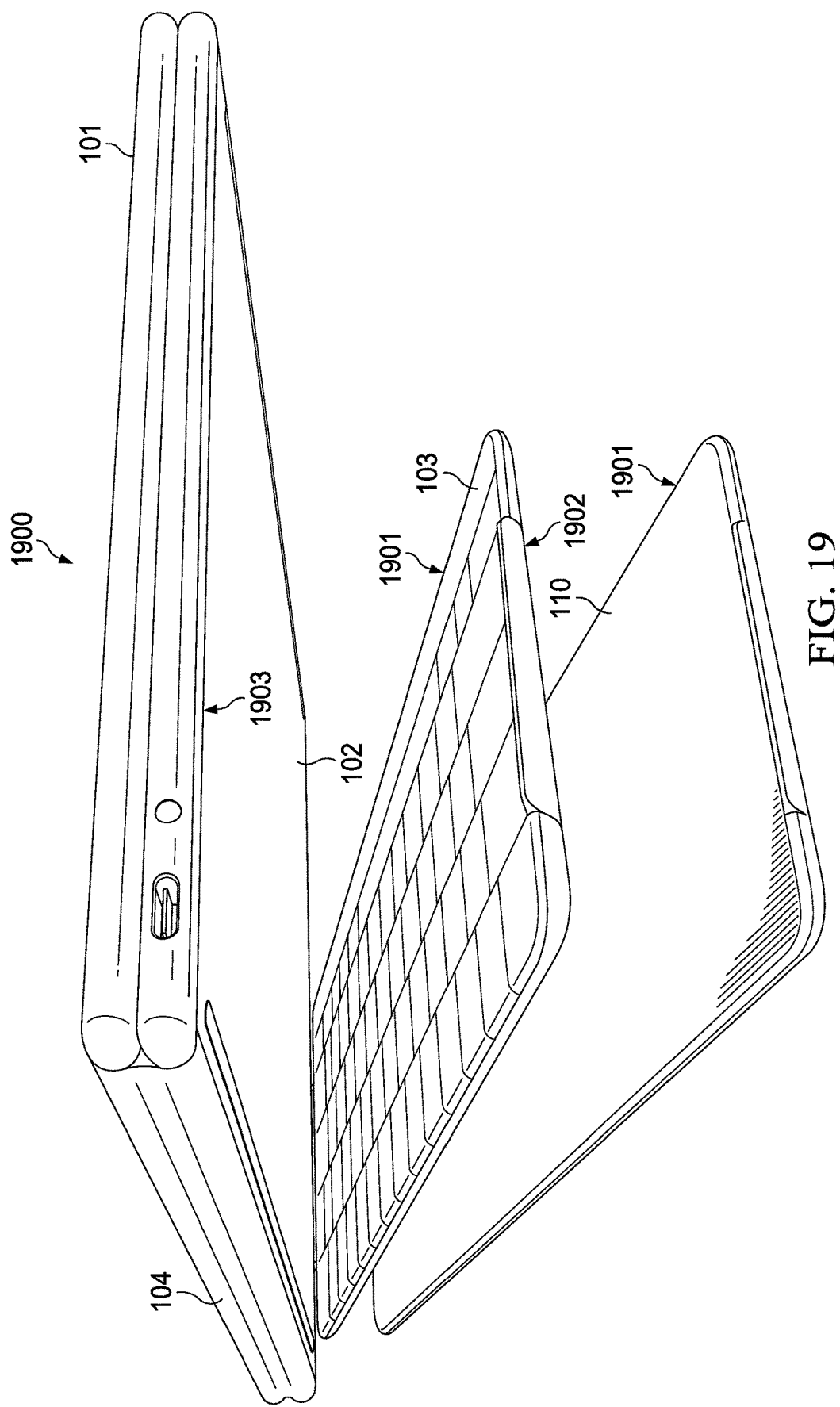
FIG. 19 illustrates an accessory backpack system, according to some embodiments.

Hinge configuration 1600B of FIG. 16B shows a closed posture. In this case, gear hinge 104 holds display 101 facing down, and display 102 is rotated 360° degrees with respect to display 101, so that its display surface faces up against display 101. In this configuration, keyboard 103 may sit under display 102, for example, to cause display 102 to rest at an angle when IHS 100 is placed in laptop posture. In some cases, keyboard 103 may be coupled to the back of display 102 using an accessory backpack or the like, as shown in FIG. 19.

Hinge configuration 1600C of FIG. 16C shows a tablet or book posture. In this case, gear hinge 104 holds display 102 facing up, and display 101 is rotated 360° degrees with respect to display 102, so that its display surface faces down against the horizontal plane. In this configuration, keyboard 103 rests between the back of display 101 and the back of display 102. In various embodiments, bar 1603 may be split into a plurality of segments or links, as shown in configurations 1600B and 1600C, to provide additional axes of rotation between displays 101 and 102, and to accommodate both keyboard options with different IHS thicknesses.

FIGS. 17A and 17B illustrate a slide hinge implementation, usable as hinge 104 in IHS 100, in various configurations. Specifically, in FIG. 17A, link 1701, held by first display bracket 1702 coupled to display 101, slides up and down slot 1704 of bracket 1703 coupled to display 102. In some cases, a locking mechanism may be employed to stably hold displays 101 and 102 in different postures, as link 1701 slides up and down and/or as display 101 rotates around display 102, such as the closed posture of configuration 1700A, the laptop posture of configuration 1700B in FIG. 17B, the tablet posture of configuration 1700C (back to FIG. 17A), or the book posture of configuration 1700D (also in FIG. 17A).

FIGS. 18A and 18B illustrate a folio case system in configurations 1800A and 1800B, according to some embodiments. Specifically, folio case 1801 may include a set of hard foldable sections or flaps wrapped in fabric and/or plastic, with snapping magnetic attachment points, for example, around the edge on the back of displays 101 and 102, and/or keyboard 103. In some cases, keyboard 103 may be removable from case 1801. Additionally, or alternatively, the presence and state of case 1801 may be detectable via sensors 303.

In configuration 1800A in FIG. 18A, displays 101 and 102 are in a laptop posture, and folio case 1801 holds keyboard 103 in a fixed position, off the bottom edge or long side of display 102, such that both displays 101 and 102 remain usable. Meanwhile, configuration 1800B of FIG. 18B shows a display posture (e.g., as in state 901), such that the display surface of display 102 is facing down against folio case 1802, and folio case 1802 holds keyboard 103 in at fixed location, off the bottom edge of display 101, and such that only display 101 is usable.

FIG. 19 illustrates accessory backpack system 1900. In some embodiments, the enclosure of display 102 may include notches 1903 configured to receive lip 1902 of tray 1901, which stays snapped in place until pulled by the user. Additionally, or alternatively, a spring-loaded ejection button may be used. In various configurations, tray 1901 may hold keyboard 103 or battery 110. Moreover, in some cases, the enclosure of display 102 may include electrical terminals usable to charge and/or obtain sensor information from accessories.

Context-Aware User Interface (UI)

In various embodiments, systems and methods described herein may provide a context-aware UI for IHS 100. For instance, GUI objects such as ribbon area 106 and touch input area 107 may be selected, configured, modified, provided, or excluded based upon the context in which IHS 100 is operating.

For example, during operation of IHS 100, an application or window may occupy a part of a display ("single display window mode"), it may occupy an entire display ("max mode"), it may span across parts of the two displays ("dual display window mode"), or it may occupy both entire displays ("supermax mode"). Moreover, when in a laptop or tablet posture mode, for instance, a user may place a supported physical keyboard 103, totem (e.g., a DELL TOTEM), or another accessory on the surface of second display 102. Additionally, or alternatively, the user may bring up an OSK on second display 102.

Still during operation of IHS 100, the user may move keyboard 103 to different positions on the display surface of second display 102. Additionally, or alternatively, the user may close, open, minimize, or maximize an application or window. Additionally, or alternatively, the user may transition IHS 100 between different display postures. Additionally, or alternatively, the user may dock IHS 100 on a docking system or the like, thereby modifying the IHS's docking state (e.g., dual monitor mode, book mode, or laptop mode).

In response to these, or other events, IHS 100 may select, render, modify, expand, reduce, and/or exclude various UI components or GUI objects such as: applications, OSKs, touch bars, touchpads, workspaces, taskbars, start menus, etc., in a context-aware manner. These context-aware operations may be performed, for example, based on docking state, active application, touchpad area, physical keyboard placement and area, totem placement (if any), etc.

For instance, in response to changes in docking state, IHS 100 may bring up, hide, or resize an "f-row interface" comprising one or more of: a "system bar," a "touch bar," and an "activity bar;" as well as the contents (e.g., icons, keys, text, colors, images, suggestions, shortcuts, input areas, etc.) of each such bar. Additionally, or alternatively, IHS 100 may bring up, configure, hide, or resize OSKs, touchpad areas, scratch pad areas, or totem menus. Additionally, or alternatively, IHS 100 may reduce or increase desktop or workspace areas that span two displays, and it may move OS components, such as a taskbar and start menu, across displays 101 and 102.

In an embodiment, a user may manually configure one or more GUI components, elements, or objects (e.g., f-row interface, touchpad, OSK, icons, images, windows, etc.) with a desired size and selected contents, and the user may also choose taskbar/start menu icon locations with posture-dependent, event-specific triggers and behaviors. In another embodiment, a software service may a docking state changes, posture changes, user configuration changes (e.g., user brings up OSK mode), placement of a keyboard, totem placed on display, active application, etc., and it may take automatic responsive actions. In some cases, second display 102 may display touch bar content that is selected based upon other content displayed on first display 101 (e.g., an active application).

Figure 20A:
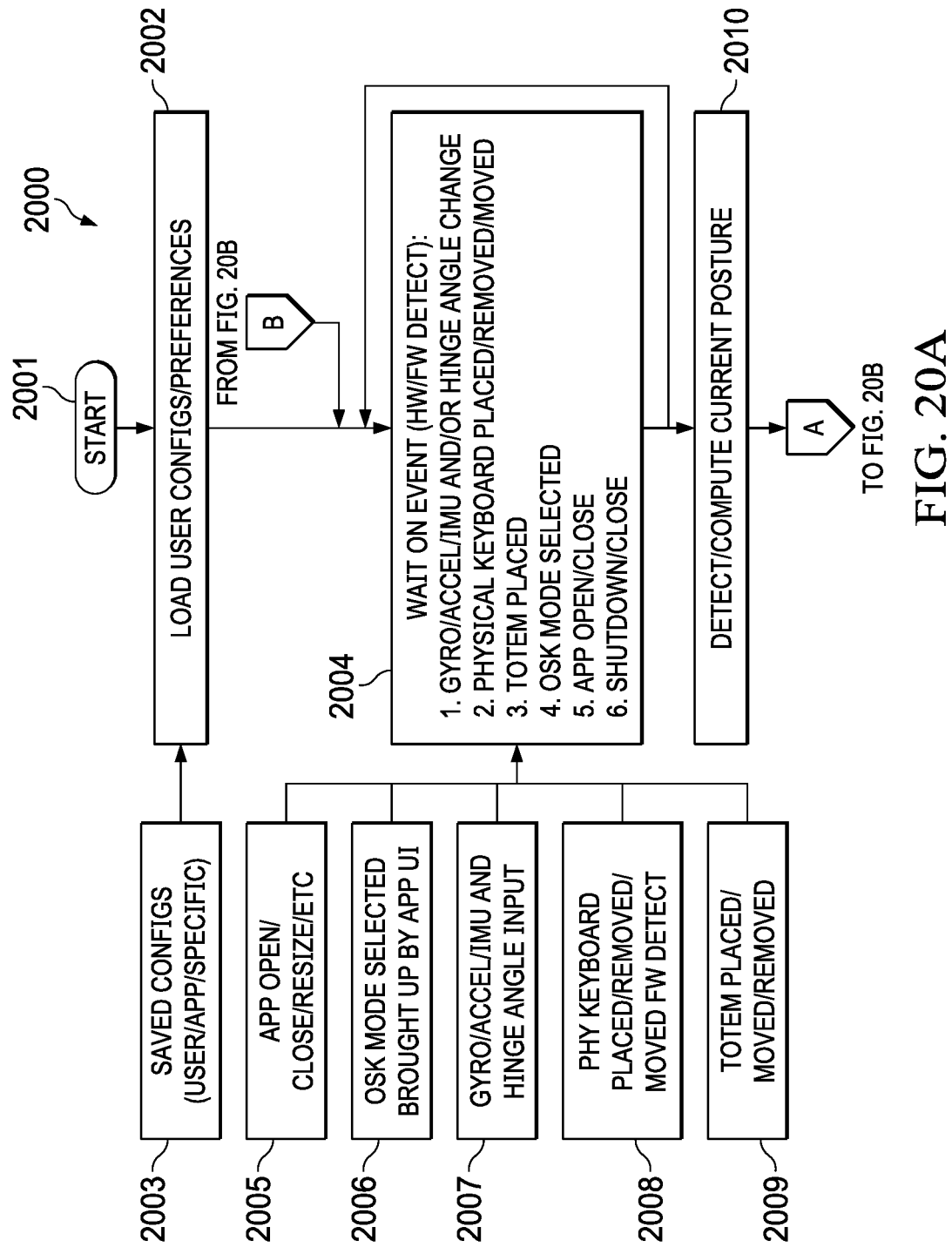
FIGS. 20A and 20B are a flowchart of a method for providing context-aware User Interface (UI), according to some embodiments.
Figure 20B:
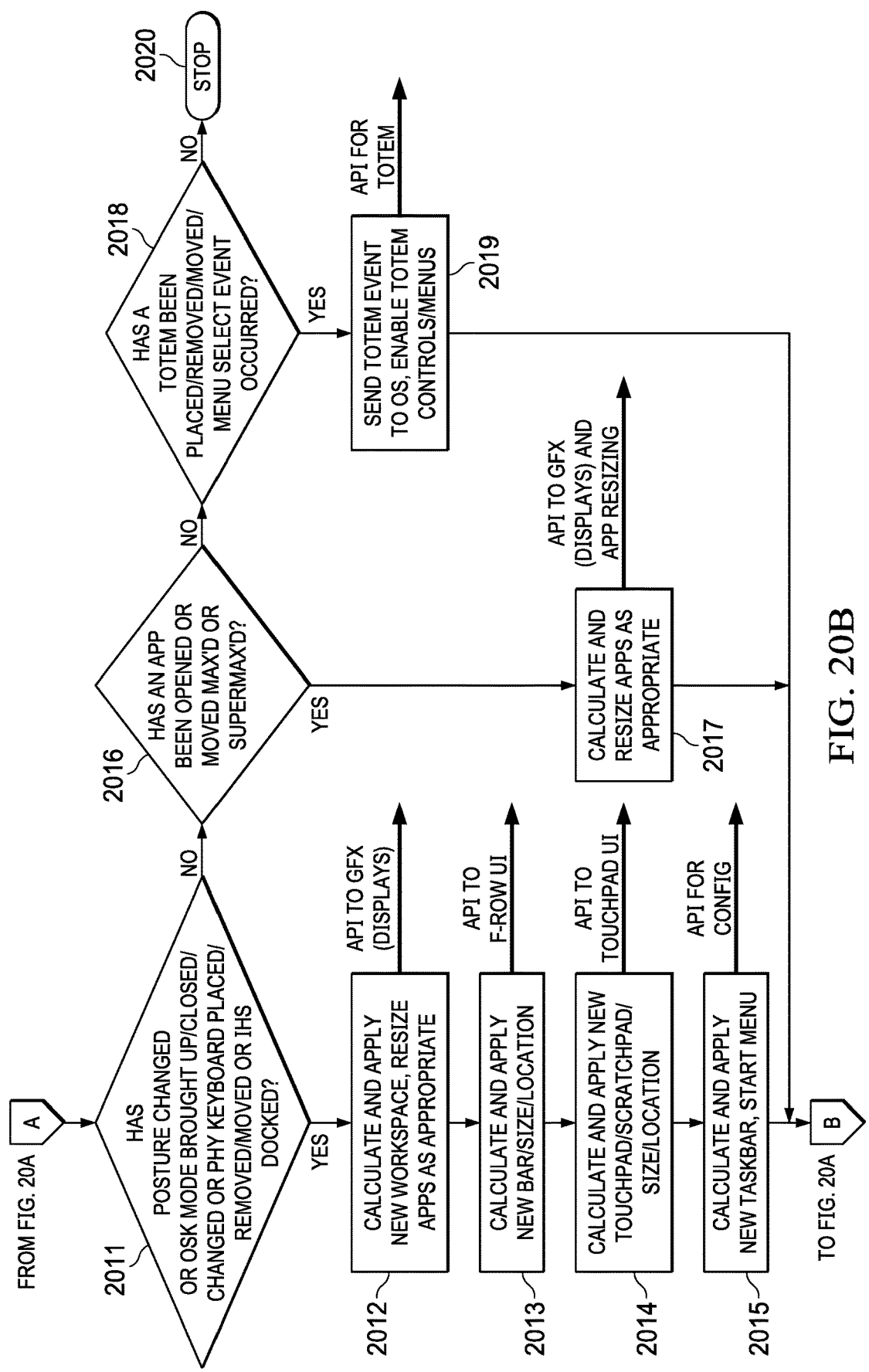

FIGS. 20A and 20B are a flowchart of method 2000 for providing a context-aware UI. In some embodiments, method 2000 may be performed by multi-form factor configuration engine 401 under execution of processor 201. Particularly, method 2000 starts at block 2001.

At block 2002, method 2000 loads user configuration and/or preferences from saved configuration files 2003. For example, configuration files 2003 may be saved in a database and stored in memory storage devices 203/207. In various embodiments, configuration files 2003 may contain user and/or application—specific settings that control the behavior of GUI components such as, for example, touch bar 106 and touchpad 107, in response to selected events. For example, configuration files 2003 may prioritize the rendering of one or more sub-components of touch bar 106 (e.g., a system bar, a touch bar, or an activity bar) and/or one or more sub-components of touch input area 107 (e.g., a trackpad and one or more scratchpad areas), according to the user's personal preferences, depending upon the position of keyboard 103 on second display 102 and/or the docking state of IHS 100.

At block 2004, method 2000 waits for an event to be received from any of blocks 2005-2009. Specifically, block 2005 indicates when an application is open, closed, or resized, and block 2006 indicates when an OSK mode is selected or brought up by an application (also examples of GUI IN 402 inputs in FIG. 4). Block 2007 detects and identifies changes in display posture, for example, using a gyroscope, accelerometer, IMU, hinge sensor, etc.; whereas blocks 2008 and 2009 detect the presence, position, and status of keyboard 103, totem, or other accessory, including moving and removal events, for example, using display, hinge, and keyboard sensors (also examples of sensor data 406-408 of FIG. 4).

At block 2010, method 2000 determines a current posture of IHS 100 using data from blocks 2005-2009 by comparing the various current states of different IHS components to the corresponding states expected for each posture. Block 2011 determines whether: (i) the posture has changed; (ii) OSK mode has been brought up, closed, or changed, or (iii) keyboard 103 has been placed, moved, or removed, or (iv) the IHS has been docked, and in which state.

If so, block 2012 may calculate and apply a new workspace or desktop area by resizing and/or closing applications and windows using OS-specific (e.g., WINDOWS) API-based graphics (GFX) commands. Block 2013 may calculate and apply new ribbon area bars and components, with selected sizes and at predetermined locations, using the API to generate f-row UI commands. Similarly, block 2014 may calculate and apply new touch input area components such as a touchpad and one or more strachpad(s), with selected sizes and at predetermined locations, using the API to generate touchpad UI commands. In some cases, method 2000 may also calculate and apply OS components at block 2015, such as a taskbar or start menu, with selected sizes and at predetermined locations, using the API to generate OS configuration commands. After any of blocks 2012-2015, control returns to block 2004.

At block 2016, method 2000 determines whether an application has been opened, moved, minimized, maximized, or super-maximized. If so, block 2017 may calculate and resize applications and windows using the API, and control returns to block 2004. At block 2018, method 2000 determines whether a totem has been placed, removed, or moved, or whether a totem menu selection event has occurred. If so, block 2019 may send a totem event notification to the OS and/or it may enable totem controls using the API, and then control returns to block 2004. Otherwise, method 2000 ends at block 2020.

Docking System

In various embodiments, multi-form factor IHS 100 may be used with a docking system as described herein. Such a docking system may operate as a stand, to mechanically support displays 101 and 102 in different postures and orientations, and it may also enable IHS 100 to be connected and disconnected to and from any of a plurality of power sources (e.g., AC power) and/or peripheral components (e.g., an external graphics processor) coupled or built into to the docking system.

Figure 21A:
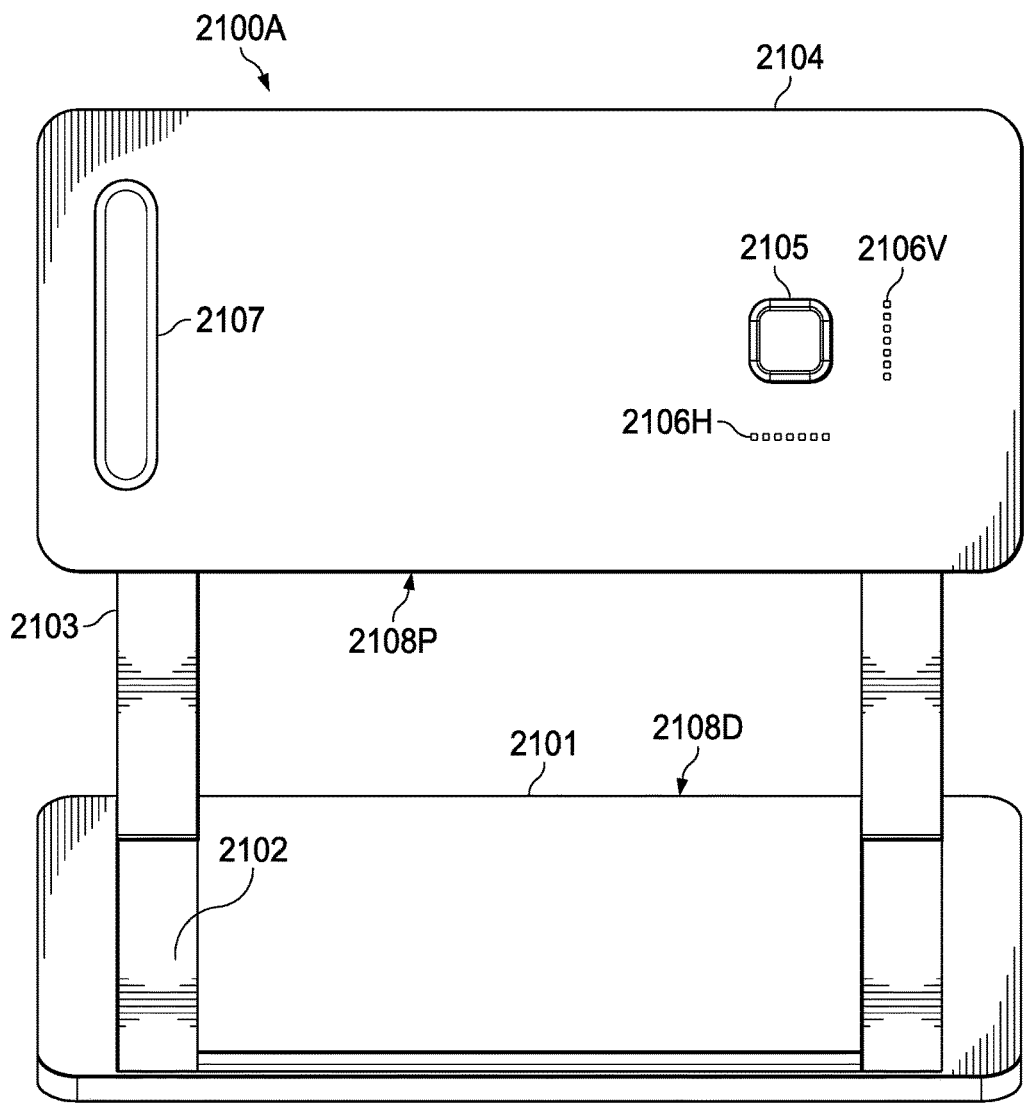
FIGS. 21A-C illustrate a dock in different positions, according to some embodiments.
Figure 21B:
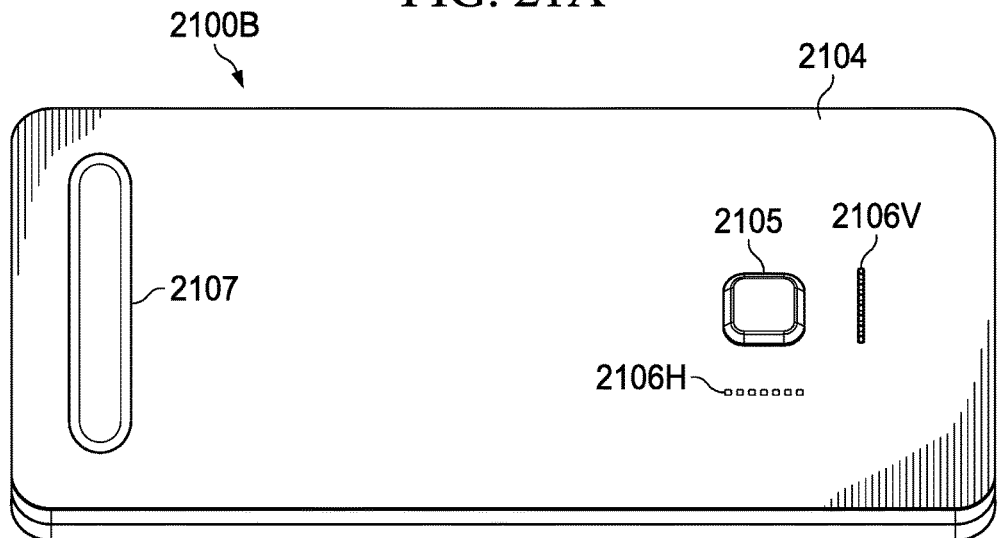
Figure 21C:
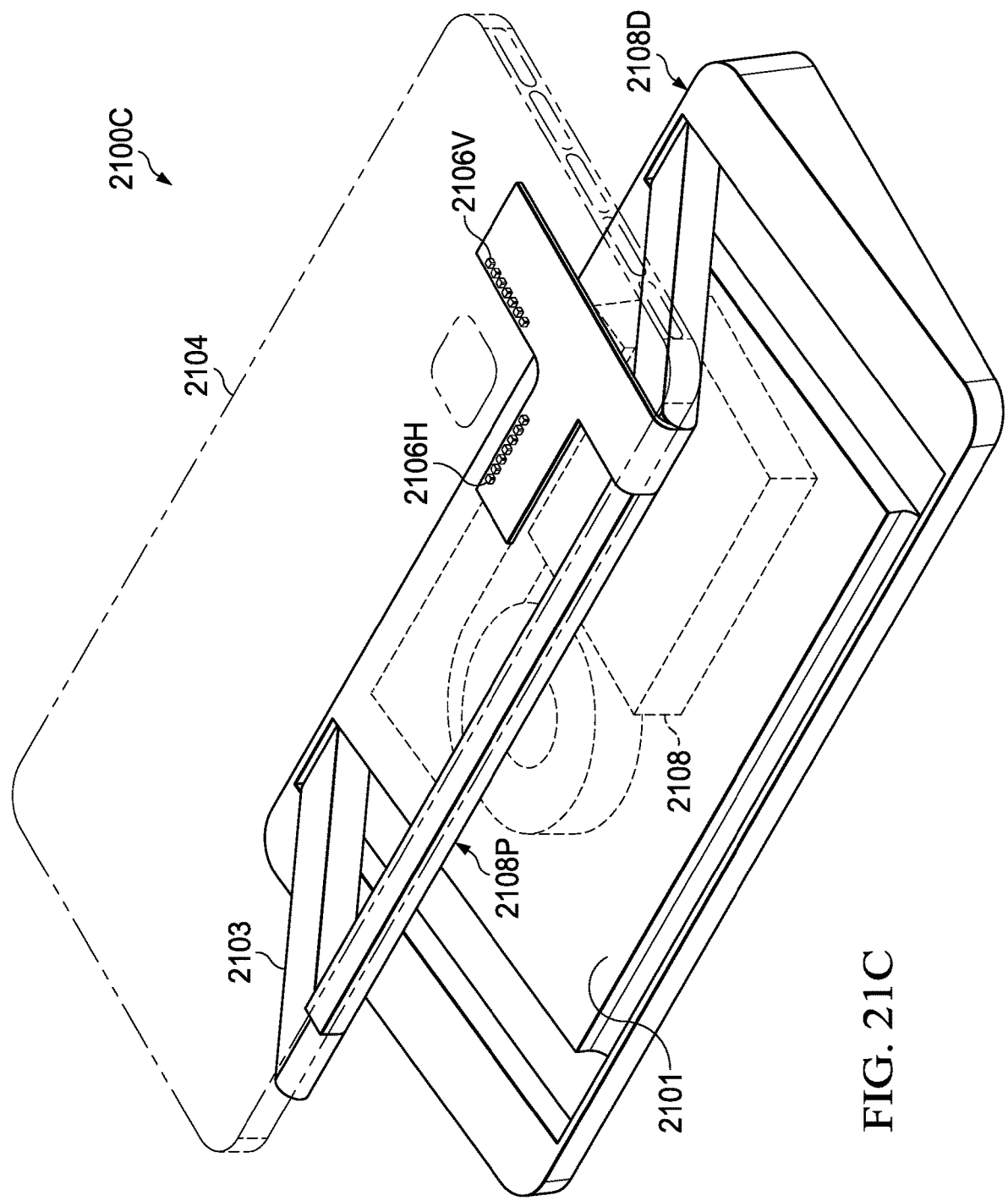

FIGS. 21A-C illustrate a docking system in different positions. In FIG. 21A, docking system 2100A is shown with base 2101 and plateau 2104 coupled to each other via arm(s) 2103 (in this example, two arms are used). Both base 2101 and plateau 2104 may be generally rectangular in shape, and may have a width configured to match the width of a single one of displays 101/102. Base 2101 sits horizontally on a table or desk surface, and when IHS 100 is docked on docking system 2100A, the back surface of display 101 and/or the back surface of display 102 is/are coupled to and rest(s) against the top surface of plateau 2104.

Arm(s) 2103 couple distal edge 2108D of base 2101 (relative to a user standing in front of docking system 2100) to proximal edge 2108P of plateau 2104. As such, arm(s) 2103 swivel, hinge, or rotate with respect to base 2101 around a first axis to lift plateau 2104 vertically and away from the horizontal surface. Arm(s) 2103 also swivel, hinge, or rotate around a second axis to tilt plateau 2104, hence angling displays 101/102 towards or away from a user. When retracted into position 2100B, arm(s) 2103 fall into recessed track(s) 2102 of base 2101, such that the bottom surface of plateau 2104 rests against the top surface of base 2101.

The top or outer surface of plateau 2104 includes positioning nib 2105 with horizontal row of connector terminals 2106H and/or vertical column of connector terminals 2106V. In some implementations, positioning nib 2105 may be generally square in shape, which allows IHS 100 to be supported by docking system 2100 in at least two orientations, 90° rotated with respect to each other.

Horizontal terminals 2106H may be disposed alongside a first side of square nib 2105, and vertical terminals 2106V may be perpendicular thereto. For example, horizontal row of terminals 2106H may provide a first bus connector (e.g., USB) and vertical column of terminals 2106V may provide a different bus connector or a redundant bus connector, in a different orientation. In various situations, terminals 2106H-V may be used to implement cooling, data, and/or charging of IHS 100.

Plateau 2104 may also include a generally rectangular magnetic device 2107 disposed in a direction perpendicular to proximal edge 2108P of plateau 2104, and configured to hold displays 101 and/or 102 in place when IHS 100 is docked. In some cases, magnetic device 2107 may include a programmed magnet or magnet array that features different North, South, East, and West poles or polarities along its length, whereas displays 101 and/or 102 of IHS 100 may include correspondingly disposed magnets with opposite poles or polarities.

In some cases, as shown dock 2100C of FIG. 21C, plateau 2104 and/or base 2101 may further include one or more peripheral devices built therein. For example, device 2108 may include a cooling fan and/or graphics processor 2108 coupled to terminals 2106H-V. Upon docking of IHS 100 onto plateau 2104, IHS 100 may be configured to identify the current docking state and to access or communicate with device 2108 via terminals 2106H and/or 2106V.

Figure 22A:
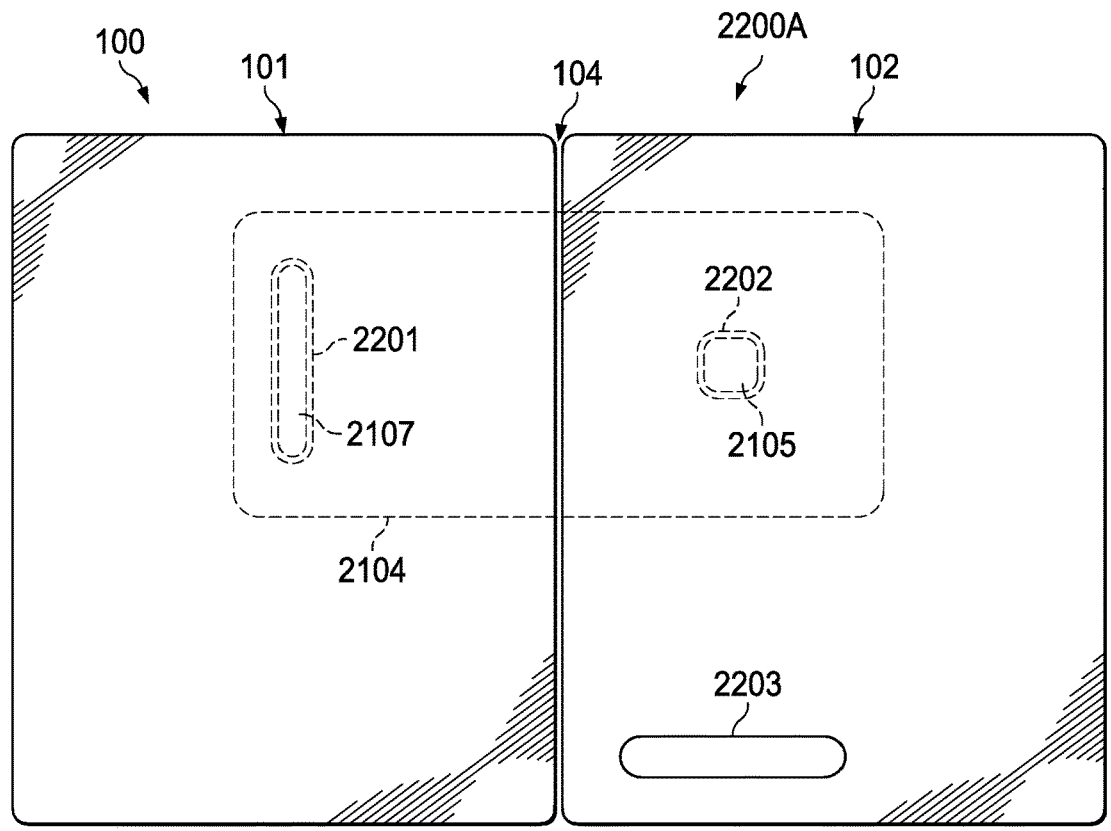
FIGS. 22A and 22B illustrate examples of docking and undocking methods, according to some embodiments.
Figure 22B:
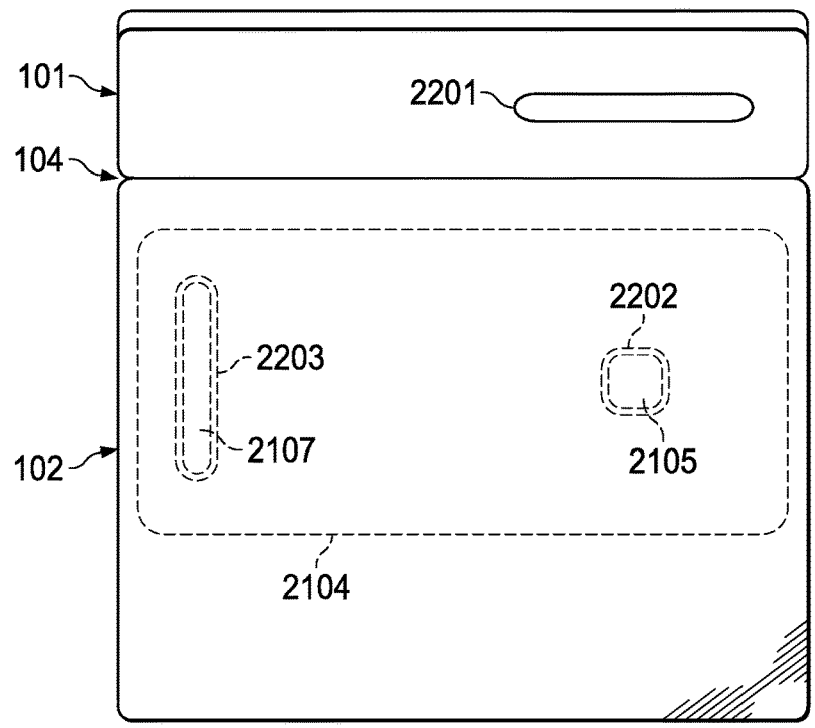
Figure 23A:
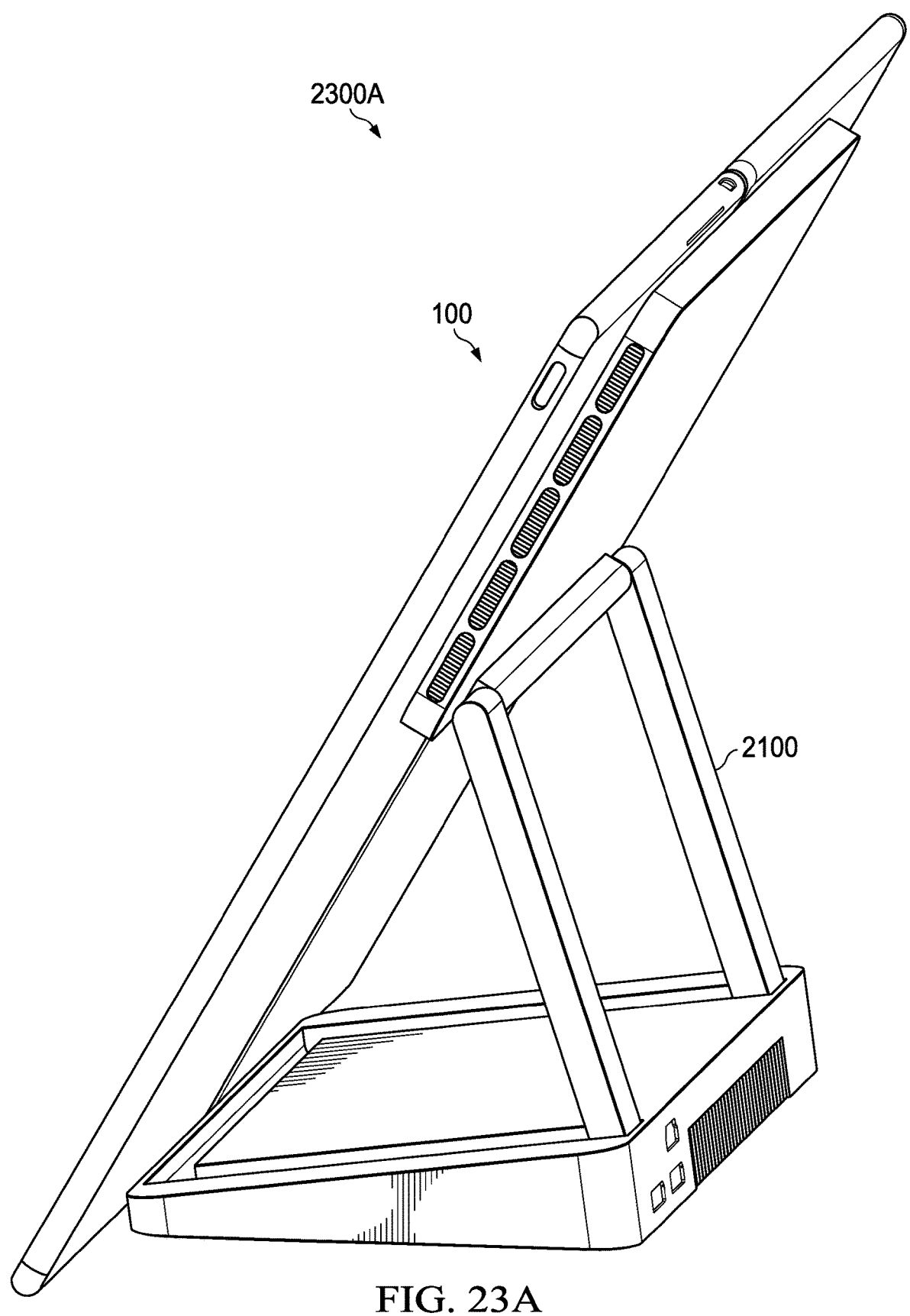
FIGS. 23A-C illustrate docking states of the multi-form factor IHS, according to some embodiments.
Figure 23B:
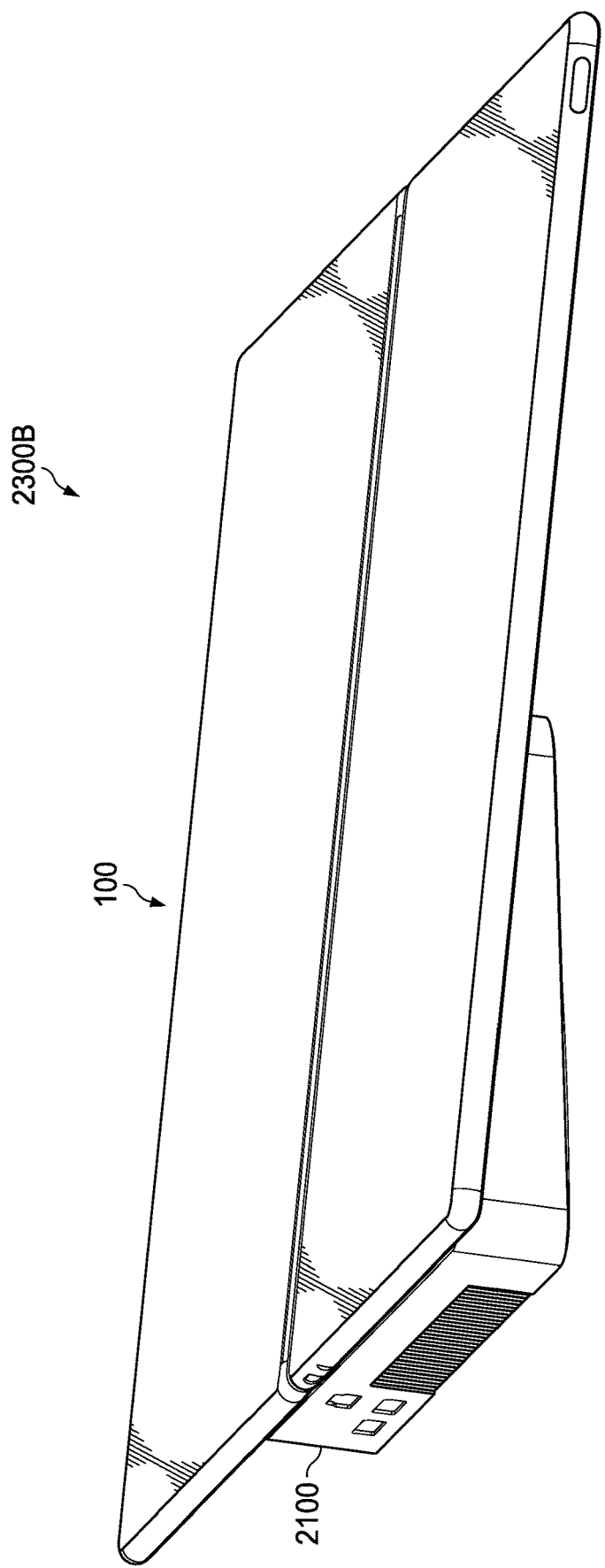
Figure 23C:
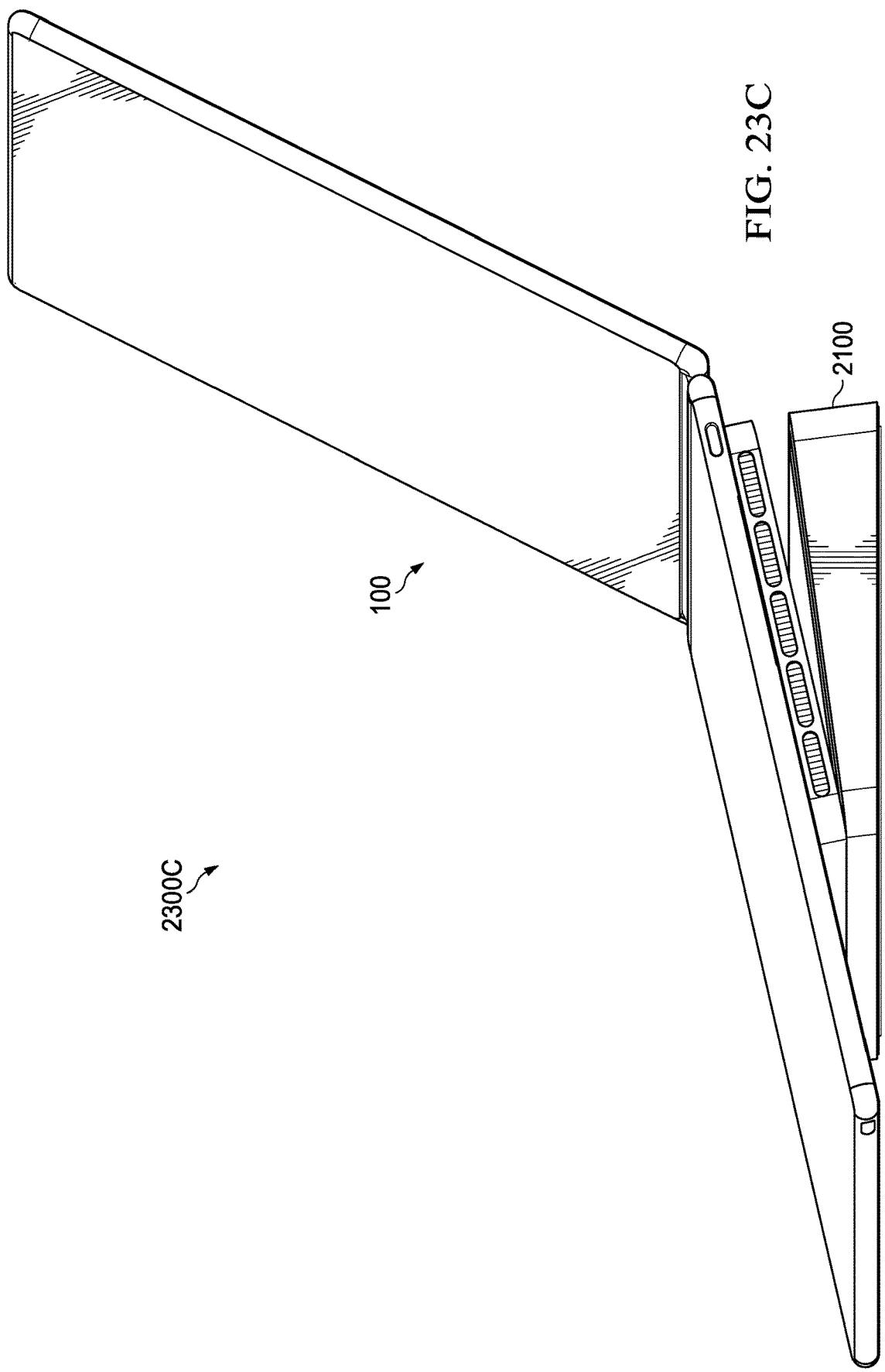

FIGS. 22A and 22B illustrate examples of docking and undocking methods, and FIGS. 23A-C show the resulting docking states. Particularly, configuration 2200A of FIG. 22A shows IHS 100 docked onto plateau 2104 in a dual monitor docking state, such as when IHS 100 is in posture 701 in FIG. 7A, or posture 905 of FIG. 9E.

In the docking process of FIG. 22A, a user may first place IHS 100 in dual monitor posture, with displays 101/102 open 180° and in a portrait orientation. The user may then align the back of second display 102 against positioning nib 2105. For example, the back of second display 102 may include a protrusion or detent 2202 configured to match the shape of positioning nib 2105, and configured to align IHS 100, in response to IHS 100 being positioned against the top surface of plateau 2104. In some cases, protrusion or detent 2202 may be male and positioning nib 2105 may be female, or vice-versa.

First display 101 may include magnetic device 2201 (with opposite polarity as magnetic device 2107 of plateau 2104) configured such that, when detent 2202 is aligned with nib 2105, magnetic device 2107 snaps or holds IHS 100 in place against plateau 2104 (in this case, magnetic device 2203 within second display 102 is not engaged).

As a result of the process of FIG. 22A, FIG. 23A shows IHS 100 and docking system 2100 in dual-display docking mode 2300A and FIG. 23B shows book docking mode 2300B. Arm 2103 may be actuated to hold plateau 2104 in a dual-display docking state 2300A by extending arm 2013 to increase the angle between plateau 2104 and the horizontal surface. Conversely, arm 2103 may be retracted all the way down to a book docking state 2300B by decreasing the angle between plateau 2104 and the horizontal surface.

In some cases, arm 2103 may have friction couplings configured to hold IHS 100 in any intermediate angle or position. The lateral edges of displays 101/102 may rest against the horizontal surface as arm 2103 swivels up and down. In some cases, base 2101 may be wedge shaped, with the height near its distal edge greater than the height near its proximal edge, in order to provide a natural display angle to the user in book docking mode 2300B.

As part of the docking process of FIG. 22B, a user may first place IHS 100 in laptop posture. The user may then align the back of second display 102 against positioning nib 2105. Again, the back of second display 102 may include detent 2202 configured to mate with nib 2105, and to align IHS 100 in response to it being positioned against the stop surface of plateau 2104. Second display 102 may also include magnetic device 2203 (with opposite polarity as magnetic device 2107) configured such that, when detent 2202 is aligned with nib 2105, magnetic device 2203 snaps or holds IHS 100 in place (in this case, magnetic device 2201 within first display 101 is not engaged).

As a result of the process of FIG. 22B, FIG. 23C shows IHS 100 and docking system 2100 in laptop docking mode 2300C. In some cases, arm 2103 may be actuated to hold plateau 2104 at a fixed distance from base 2101, for example, in order to provide leave a gap between plateau 2104 and base 2201 that is usable for cooling IHS 100.

Active Cooling

In some embodiments, docking system 2100A-C may improve the performance of multi-form factor IHS 100 by providing active cooling features. Conventional cooling docks operate by simply blowing cold air onto the IHS chassis, and therefore do not have a significant benefit over the internal cooling already being performed by multi-form factor IHS 100 itself. In contrast, systems and methods described herein enable active cooling of multi-form factor IHS 100 by directly connecting a heatpipe, internal to IHS 100, to a heatsink element embedded within or coupled to plateau 2104 of dock 2100A-C, such that cooling may be delivered directly from the dock's heatsink to the IHS's internal heatpipe.

The dock's heatsink may include, for example, a thermoelectric element (e.g., a Peltier device or solid-state heat pump) or a magnetocaloric element located behind secondary display 102. The temperature of the heatsink may be measured and controlled to provide a selected amount of cold delivered or heat extracted. In some cases, an active cooling method may control operation of the heatsink in response to a detected posture of multi-form IHS 100, for example, when IHS 100 is coupled to dock 2100A-C (e.g., dual-monitor mode or laptop mode). In this way, CPU and GPU temperatures inside multi-form IHS 100 may be controlled with more precision and/or used to enable overclocking (e.g., with liquid cooling), to maximize or increase performance.

FIG. 24 illustrates an example of dock 2400. Particularly, dock 2400 includes actively controlled heatsink 2401 located in plateau 2104 around positioning nib 2105, which serves as point of direct contact between heatsink 2105 and a first end of heatpipe 2402 within IHS 100. Heatpipe 2402 is entirely disposed inside IHS 100; but it may be exposed at a location corresponding to that of positioning nib 2105, on the bottom surface of the IHS chassis. Inside IHS 100, second end of heatpipe 2402 is coupled to fan assembly 2403 (i.e., another "heatsink"). Plateau 2104 may also include cooling ribs 2404 configured to dissipate heat from the hot side of heatsink 2401, as well as linear flow fan 2405 behind primary display 101.

In some cases, heatsink 2401 may include a solid-state heat pump. Thermoelectric cooling uses the Peltier effect to create a heat flux between two different types of materials and transfers heat from one side of the device to the other, with consumption of electrical energy, depending on the direction and/or magnitude of an electrical voltage and/or current applied to the device. Such a heatsink 2401 may also include a Peltier device, Peltier heat pump, solid state refrigerator, or a thermoelectric cooler (TEC). Alternatively, heatsink 2401 may include a magnetocaloric element, such that temperature change of the element is caused by exposing it to a changing magnetic field, for example, by changing direction and/or magnitude of an electrical voltage and/or current.

Figure 25:
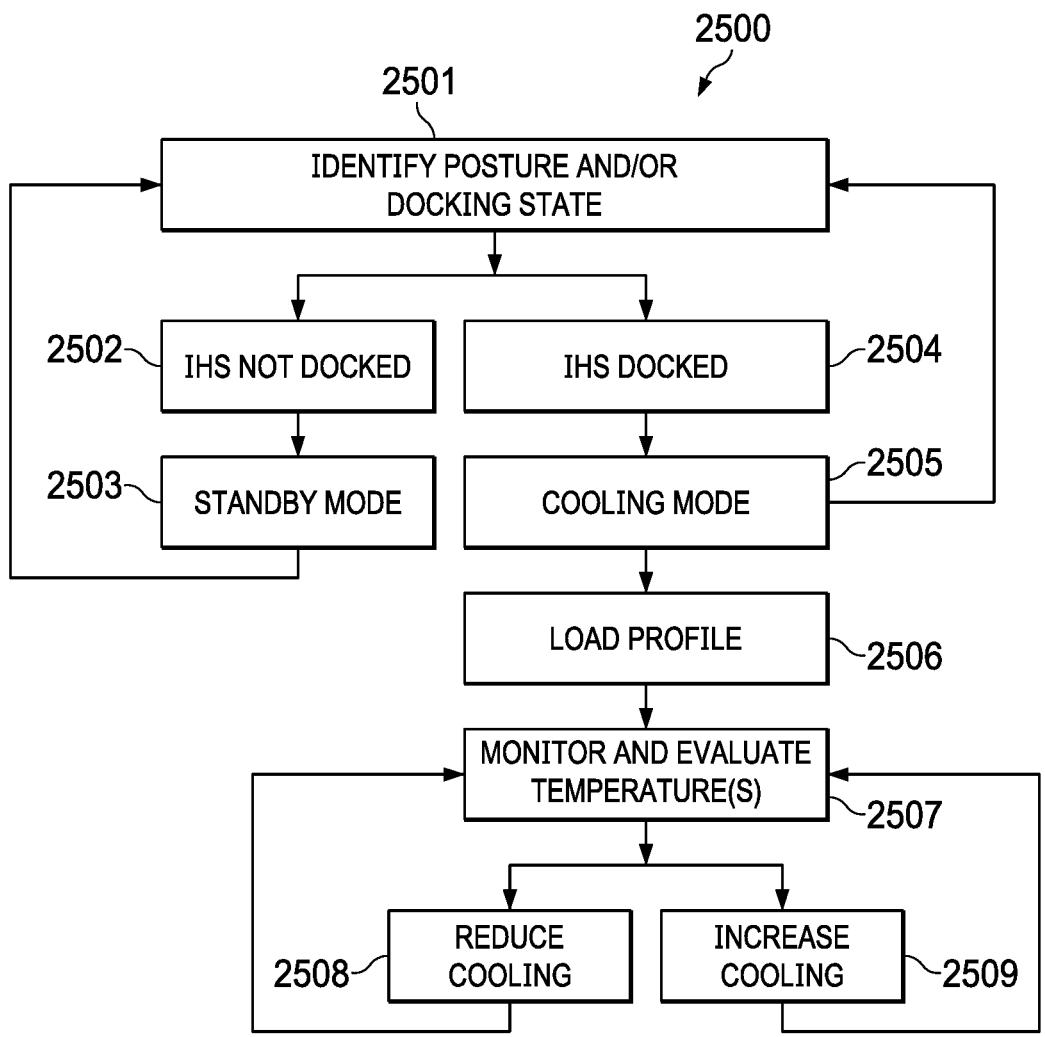
FIG. 25 illustrates a method for actively cooling a multi-form factor IHS using a dock, according to some embodiments.

FIG. 25 illustrates a method for actively cooling multi-form IHS 100 using dock 2400. In some cases, heatsink 2401 may be controlled by multi-form factor IHS 100 using electrical terminals located on the bottom surface of secondary display 102 that mate with terminals 2106H and/or 2106V of plateau 2104. Additionally, or alternatively, dock 2400 may itself include a processor/controller and memory with program instructions configured to control the operation of heatsink 2401.

At block 2501, method 2500 identifies a posture and/or docking state of IHS 100. For example, block 2501 may determine whether terminals 2106H and/or 2106V of plateau 2104 are coupled to mating terminals on the bottom of secondary display 102. Additionally, or alternatively, block 2501 may detect an angle of hinge 104, and it may identify a corresponding posture of the docked IHS as being in dual-monitor mode, book mode, or laptop mode.

At block 2502, if IHS 100 is not docked, control passes to block 2503, where heatsink 2401 is operated in a standby or low-power mode. At block 2504, if IHS 100 is docked, control passes to block 2505, where heatsink 2401 is operated in a cooling mode. Block 2506 loads a device profile for IHS 100, which may include a table of settings and parameters usable to control the operation of heatsink 2401. For example, such a device profile may include an operating temperature requirement or specification for IHS 100.

Block 2507 monitors and evaluates the current temperature of IHS 100 (or a component thereof). At block 2508, if the present temperature of IHS 100 is smaller than the maximum temperature for the IHS, in its current posture, method 2500 may reduce the cooling provided by heatsink 2401, for example, by reducing an electrical voltage or current applied to a heat pump. Conversely, at block 2509, if the present temperature of IHS 100 is greater than or equal to than the maximum temperature for IHS 100 in its current posture, method 2500 may increase the cooling provided by heatsink 2401, for example, by increasing an electrical voltage or current applied to a heat pump. In some cases, the cooling requirements may be different for different postures when IHS 100 is in a docked state.

It should be understood that various operations described herein may be implemented in software executed by logic or processing circuitry, hardware, or a combination thereof. The order in which each operation of a given method is performed may be changed, and various operations may be added, reordered, combined, omitted, modified, etc. It is intended that the invention(s) described herein embrace all such modifications and changes and, accordingly, the above description should be regarded in an illustrative rather than a restrictive sense.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. A system, comprising:
an Information Handling System (IHS) comprising:
a first display coupled to a second display;
at least one processor; and
a memory coupled to the at least one processor, the memory having program instructions stored thereon that, upon execution, cause the at least one processor to:
identify whether the IHS is in a dual-monitor mode or a laptop mode; and
control an operation of a heatsink, at least in part, in response to the identification; and
a dock comprised of:
a base;
a plateau supporting the IHS, disposed thereon;
two arms parallel to each other, wherein each arm is fixedly coupled at a distal edge of the base at a first end and at a proximal edge of the plateau at a second end relative to a user standing in front of the dock, wherein the plateau comprises the heatsink contacting and cooling a heatpipe disposed within the IHS via a bottom surface of the IHS.

2. The system of claim 1, wherein the heatsink comprises a solid-state heat pump.

3. The system of claim 1, wherein the heatsink comprises a magnetocaloric element.

4. The system of claim 1, wherein the plateau further comprises a positioning nib.

5. The system of claim 4, wherein the heatsink contacts a first end of the heatpipe via the positioning nib.

6. The system of claim 5, wherein a second end of the heatpipe is coupled to a fan assembly within the IHS.

7. The system of claim 6, wherein the plateau further comprises a fan directed toward the bottom surface of the IHS.

8. The system of claim 1, wherein each arm comprises: (a) the first end fixedly attached at the distal edge of the base, wherein rotation of the first end around a first pivoting axis lifts the plateau from the base, and (b) the second end fixedly attached at the proximal edge of the plateau, wherein rotation of the second end around a second pivoting axis tilts the plateau with respect to the base, and wherein the second pivoting axis is parallel with respect to the first pivoting axis.

9. The system of claim 1, wherein in the dual-monitor mode the first and second displays are arranged at a 180° angle with respect to each other, and wherein in the laptop mode the first display is facing the user at an obtuse angle with respect to a second display surface of the second display.

10. The system of claim 8, wherein movement of the arms around the first pivoting axis completely separates the plateau from the base.

11. The system of claim 1, wherein the arms fall into recessed tracks in the base.

* * * * *